United States Patent [19]
Wolk et al.

[11] Patent Number: 6,140,009
[45] Date of Patent: Oct. 31, 2000

[54] THERMAL TRANSFER ELEMENT FOR FORMING MULTILAYER DEVICES

[75] Inventors: Martin B. Wolk, Woodbury; Paul F. Baude; Fred B. McCormick, both of Maplewood; Yong Hsu, Woodbury, all of Minn.

[73] Assignee: 3M Innovative Properties Company, St. Paul, Minn.

[21] Appl. No.: 09/477,966

[22] Filed: Jan. 5, 2000

Related U.S. Application Data

[63] Continuation of application No. 09/231,723, Jan. 15, 1999.
[51] Int. Cl.[7] .................. G03F 7/34; G03F 7/40; B05D 5/12
[52] U.S. Cl. ............ 430/200; 430/271.1; 430/273.1; 430/312; 430/319; 430/964; 156/234; 427/66
[58] Field of Search .................. 430/200, 964, 430/271.1, 273.1, 312, 319; 503/227; 346/135.1; 156/234; 427/66

[56] References Cited

U.S. PATENT DOCUMENTS

| | | | |
|---|---|---|---|
| 4,252,671 | 2/1981 | Smith ............................ | 252/430 |
| 4,722,583 | 2/1988 | Stewart ......................... | 350/96.15 |
| 4,833,124 | 5/1989 | Lum .............................. | 503/227 |
| 4,912,083 | 3/1990 | Chapman et al. .............. | 503/227 |
| 4,940,640 | 7/1990 | MacDiarmid ................... | 429/213 |
| 4,942,141 | 7/1990 | DeBoer et al. ................. | 503/227 |

(List continued on next page.)

FOREIGN PATENT DOCUMENTS

| | | | |
|---|---|---|---|
| 321923 | 7/1992 | European Pat. Off. ......... | B41M 5/26 |
| 0 851 714 A2 | 7/1998 | European Pat. Off. . | |
| 568993 | 8/1998 | European Pat. Off. ......... | G03F 7/004 |
| 10-208881 | 7/1998 | Japan . | |
| WO 97/15173 | 4/1997 | WIPO ............................ | H05K 3/06 |
| WO 98/03346 | 1/1998 | WIPO ............................ | B41M 5/38 |

OTHER PUBLICATIONS

Bello, Kasali A. et al., "Near–infrared absorbing Squaraine Dyes containing 2,3–Dihydroperimidine Terminal Groups", J. Chem. Soc., Chem. Commun., 1993, pp. 452–454.
Chen, C.H. and C.W. Tang, "Recent Developments in Molecular Organic Electroluminscent Materials", Macromol. Symp. 125, 1–48 (1997).
Halls, J.J.M. et al., "Light–emitting and photoconductive diodes fabricated with conjugated polymers", Thin Solid Films 276 (1996), 13–20.
Kido, Junji, "Organic Electroluminscent Devices Based on Polymeric Materials", TRIP vol. 2, No. 10, Oct. 1994, 350–5.
Garnier, Francis et al., "An All–Organic "Soft" Thin Film Transistor with Very High Carrier Mobility", Ad. Mater. 2 (1990), No. 12, 592–4.
Pei, Qibing et al., "Polymer Light–Emitting Electrochemical Cells: In Situ Formation of a Light–Emitting p–n Junction", J. Am. Chem. Soc., 1996, 118, 3922–3929.

*Primary Examiner*—Richard L. Schilling
*Attorney, Agent, or Firm*—Robert J. Pechman

[57] ABSTRACT

A thermal transfer element for forming a multilayer device may include a substrate and a multicomponent transfer unit that, when transferred to a receptor, is configured and arranged to form a first operational layer and a second operational layer of a multilayer device. In at least some instances, the thermal transfer element also includes a light-to-heat conversion (LTHC) layer that can convert light energy to heat energy to transfer the multicomponent transfer unit. Transferring the multicomponent transfer unit to the receptor may include contacting a receptor with a thermal transfer element having a substrate and a multicomponent transfer unit. Then, the thermal transfer element is selectively heated to transfer the multicomponent transfer unit to the receptor according to a pattern to form at least first and second operational layers of a device. Often, when the thermal transfer element includes a LTHC layer between the substrate and the transfer layer, the thermal transfer element can be illuminated with light according to the pattern and the light energy is converted to heat energy to selectively heat the thermal transfer element.

27 Claims, 8 Drawing Sheets

U.S. PATENT DOCUMENTS

| | | | |
|---|---|---|---|
| 4,948,776 | 8/1990 | Evans et al. | 503/227 |
| 4,948,778 | 8/1990 | DeBoer | 503/227 |
| 4,950,639 | 8/1990 | DeBoer et al. | 503/227 |
| 4,952,552 | 8/1990 | Chapman et al. | 503/227 |
| 5,023,229 | 6/1991 | Evans et al. | 503/227 |
| 5,024,990 | 6/1991 | Chapman et al. | 503/227 |
| 5,089,372 | 2/1992 | Kirihata et al. | 430/167 |
| 5,156,938 | 10/1992 | Foley et al. | 430/200 |
| 5,166,024 | 11/1992 | Bugner et al. | 430/70 |
| 5,171,650 | 12/1992 | Ellis et al. | 430/20 |
| 5,244,770 | 9/1993 | DeBoer et al. | 430/200 |
| 5,256,506 | 10/1993 | Ellis et al. | 430/20 |
| 5,286,604 | 2/1994 | Simmons, III | 430/286 |
| 5,340,699 | 8/1994 | Haley et al. | 430/302 |
| 5,351,617 | 10/1994 | Williams et al. | 101/467 |
| 5,360,694 | 11/1994 | Thien et al. | 430/200 |
| 5,387,496 | 2/1995 | DeBoer | 430/322 |
| 5,401,607 | 3/1995 | Takiff et al. | 430/253 |
| 5,501,938 | 3/1996 | Ellis et al. | 430/201 |
| 5,521,035 | 5/1996 | Wolk et al. | 430/20 |
| 5,593,808 | 1/1997 | Ellis | 430/261 |
| 5,605,780 | 2/1997 | Burberry et al. | 430/278.1 |
| 5,612,165 | 3/1997 | Ellis | 430/201 |
| 5,622,795 | 4/1997 | Ellis | 430/14 |
| 5,685,939 | 11/1997 | Wolk et al. | 156/234 |
| 5,688,551 | 11/1997 | Littman et al. | 430/201 |
| 5,691,114 | 11/1997 | Burberry et al. | 430/302 |
| 5,693,446 | 12/1997 | Staral et al. | 430/201 |
| 5,707,745 | 1/1998 | Forrest et al. | 428/432 |
| 5,710,097 | 1/1998 | Staral et al. | 503/227 |
| 5,747,217 | 5/1998 | Zaklika et al. | 430/158 |
| 5,756,240 | 5/1998 | Roberts et al. . | |
| 5,937,272 | 8/1999 | Tang | 438/158- |

THERMAL TRANSFER ELEMENT FOR FORMING MULTILAYER DEVICES

This application is a continuation of U.S. patent application Ser. No. 09/231,723, filed Jan. 15, 1999, now allowed, incorporated herein by reference.

FIELD OF THE INVENTION

This invention relates to thermal transfer elements and methods of transferring layers to form devices on a receptor. In particular, the invention relates to a thermal transfer element having a multicomponent transfer unit and methods of using the thermal transfer element for forming a device, such as an optical or electronic device, on a receptor.

BACKGROUND OF THE INVENTION

Many miniature electronic and optical devices are formed using layers of different materials stacked on each other. These layers are often patterned to produce the devices. Examples of such devices include optical displays in which each pixel is formed in a patterned array, optical waveguide structures for telecommunication devices, and metal-insulator-metal stacks for semiconductor-based devices.

A conventional method for making these devices includes forming one or more layers on a receptor substrate and patterning the layers simultaneously or sequentially to form the device. In many cases, multiple deposition and patterning steps are required to prepare the ultimate device structure. For example, the preparation of optical displays may require the separate formation of red, green, and blue pixels. Although some layers may be commonly deposited for each of these types of pixels, at least some layers must be separately formed and often separately patterned. Patterning of the layers is often performed by photolithographic techniques that include, for example, covering a layer with a photoresist, patterning the photoresist using a mask, removing a portion of the photoresist to expose the underlying layer according to the pattern, and then etching the exposed layer.

In some applications, it may be difficult or impractical to produce devices using conventional photolithographic patterning. For example, the number of patterning steps may be too large for practical manufacture of the device. In addition, wet processing steps in conventional photolithographic patterning may adversely affect integrity, interfacial characteristics, and/or electrical or optical properties of the previously deposited layers. It is conceivable that many potentially advantageous device constructions, designs, layouts, and materials are impractical because of the limitations of conventional photolithographic patterning. There is a need for new methods of forming these devices with a reduced number of processing steps, particularly wet processing steps. In at least some instances, this may allow for the construction of devices with more reliability and more complexity.

SUMMARY OF THE INVENTION

Generally, the present invention relates to thermal transfer elements and methods of using thermal transfer elements for forming devices, including optical and electronic devices. One embodiment is a thermal transfer element that includes a substrate and a multicomponent transfer unit that, when transferred to a receptor, is configured and arranged to form at least a first operational layer and a second operational layer of a multilayer device. The first operational layer is configured and arranged to conduct or produce a charge carrier or to produce or waveguide light. Another embodiment is the device formed using the thermal transfer element. In at least some instances, the thermal transfer element also includes a light-to-heat conversion (LTHC) layer that can convert light energy to heat energy to transfer the multicomponent transfer unit. The terms "first operational layer" and "second operational layer" do not imply any order of the layers in the device or in the thermal transfer element or the proximity of the two layers to each other (i.e., there may be one or more layers between the first operational layer and the second operational layer.)

Another embodiment is a thermal transfer element that includes a substrate and a multicomponent transfer unit disposed on the substrate. The multicomponent transfer unit is configured and arranged to form, upon transfer to a receptor, a first operational layer and a second operational layer of an electronic component or an optical device. In at least some instances, this thermal transfer element may also have a LTHC layer.

A further embodiment is a thermal transfer element for forming an organic electroluminescent (OEL) device. This thermal transfer element includes a substrate and a multicomponent transfer unit that is configured and arranged to form, upon transfer to a receptor, at least two operational layers of the OEL device, such as, for example, an emitter layer and at least one electrode of the OEL device. Another embodiment is an OEL device formed using the thermal transfer element.

Yet another embodiment is a thermal transfer element for forming a field effect transistor. This thermal transfer element includes a substrate and a multicomponent transfer unit that is configured and arranged to form, upon transfer to a receptor, at least two operational layers of the field effect transistor, such as a gate insulating layer and a semiconducting layer. Another embodiment is a field effect transistor formed using the thermal transfer element.

Another embodiment is a thermal transfer element for forming a waveguide. This thermal transfer element includes a substrate and a multicomponent transfer unit that is configured and arranged to form, upon transfer to a receptor, at least two operational layers of the waveguide, such as at least one cladding layer and a core layer. Another embodiment is a waveguide formed using the thermal transfer element.

A further embodiment is a method of transferring a multicomponent transfer unit to a receptor to form a device, including contacting a receptor with a thermal transfer element having a substrate and a transfer layer. The transfer layer includes a multicomponent transfer unit. The thermal transfer element is selectively heated to transfer the multicomponent transfer unit to the receptor according to a pattern to form at least a first operational layer and a second operational layer of a device. In at least some instances, the thermal transfer element includes a LTHC layer between the substrate and the transfer layer. The thermal transfer element is illuminated with light according to the pattern and the light energy is converted by the LTHC layer to heat energy to selectively heat the thermal transfer element.

It will be recognized that thermal transfer elements can also be formed with a transfer unit that is configured and arranged to transfer a single layer. It will also be recognized that items, other than devices, may be formed by transferring either a multicomponent transfer unit or a single layer.

The above summary of the present invention is not intended to describe each disclosed embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
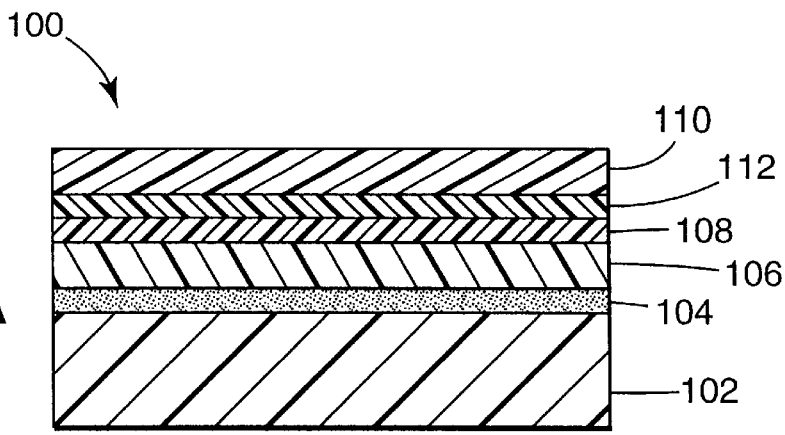
FIG. 1A is a schematic cross-section of one example of a thermal transfer element according to the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION OF THE ILLUSTRATED EMBODIMENTS

The present invention is applicable to the formation or partial formation of devices and other objects using thermal transfer and thermal transfer elements for forming the devices or other objects. As a particular example, a thermal transfer element can be formed for making, at least in part, a multilayer device, such as a multilayer active and passive device, for example, a multilayer electronic and optical device. This can be accomplished, for example, by thermal transfer of a multicomponent transfer unit of a thermal transfer element. It will be recognized that single layer and other multilayer transfers can also be used to form devices and other objects. While the present invention is not so limited, an appreciation of various aspects of the invention will be gained through a discussion of the examples provided below.

The term, "device", includes an electronic or optical component that can be used by itself and/or with other components to form a larger system, such as an electronic circuit.

The term, "active device", includes an electronic or optical component capable of a dynamic function, such as amplification, oscillation, or signal control, and may require a power supply for operation.

The term, "passive device", includes an electronic or optical component that is basically static in operation (i.e., it is ordinarily incapable of amplification or oscillation) and may require no power for characteristic operation.

The term, "active layer" includes layers that produce or conduct a charge carrier (e.g., electrons or holes) and/or produce or waveguide light in a device, such as a multilayer passive or active device. Examples of active layers include layers that act as conducting, semiconducting, superconducting, waveguiding, frequency multiplying, light producing (e.g., luminescing, light emitting, fluorescing or phosphorescing), electron producing, or hole producing layers in the device and/or layers that produce an optical or electronic gain in the device.

The term, "operational layer" includes layers that are utilized in the operation of device, such as a multilayer active or passive device. Examples of operational layers include layers that act as insulating, conducting, semiconducting, superconducting, waveguiding, frequency multiplying, light producing (e.g., luminescing, light emitting, fluorescing or phosphorescing), electron producing, hole producing, magnetic, light absorbing, reflecting, diffracting, phase retarding, scattering, dispersing, refracting, polarizing, or diffusing layers in the device and/or layers that produce an optical or electronic gain in the device.

The term, "non-operational layer" includes layers that do not perform a function in the operation of the device, but are provided solely, for example, to facilitate transfer of a transfer layer to a receptor substrate, to protect layers of the device from damage and/or contact with outside elements, and/or to adhere the transfer layer to the receptor substrate.

An active or passive device can be formed, at least in part, by the transfer of a transfer layer from a thermal transfer element. The thermal transfer element can be heated by application of directed heat on a selected portion of the thermal transfer element. Heat can be generated using a heating element (e.g., a resistive heating element), converting radiation (e.g., a beam of light) to heat, and/or applying an electrical current to a layer of the thermal transfer element to generate heat. In many instances, thermal transfer using light from, for example, a lamp or laser, is advantageous because of the accuracy and precision that can often be achieved. The size and shape of the transferred pattern (e.g., a line, circle, square, or other shape) can be controlled by, for example, selecting the size of the light beam, the exposure pattern of the light beam, the duration of directed beam contact with the thermal transfer element, and the materials of the thermal transfer element.

The thermal transfer element can include a transfer layer that can be used to form, for example, electronic circuitry, resistors, capacitors, diodes, rectifiers, electroluminescent lamps, memory elements, field effect transistors, bipolar transistors, unijunction transistors, MOS transistors, metal-insulator-semiconductor transistors, charge coupled devices, insulator-metal-insulator stacks, organic conductor-metal-organic conductor stacks, integrated circuits, photodetectors, lasers, lenses, waveguides, gratings, holographic elements, filters (e.g., add-drop filters, gain-flattening filters, cut-off filters, and the like), mirrors, splitters, couplers, combiners, modulators, sensors (e.g., evanescent sensors, phase modulation sensors, interferometric sensors, and the like), optical cavities, piezoelectric devices, ferroelectric devices, thin film batteries, or combinations thereof, for example, the combination of field effect transistors and organic electroluminescent lamps as an active matrix array for an optical display. Other items may be formed by transferring a multicomponent transfer unit and/or a single layer.

Thermal transfer of layers to form devices is useful, for example, to reduce or eliminate wet processing steps of processes such as photolithographic patterning which is used to form many electronic and optical devices. In addition, thermal transfer using light can often provide better accuracy and quality control for very small devices, such as small optical and electronic devices, including, for example, transistors and other components of integrated circuits, as well as components for use in a display, such as electroluminescent lamps and control circuitry. Moreover, thermal transfer using light may, at least in some instances, provide for better registration when forming multiple devices over an area that is large compared to the device size. As an example, components of a display, which has many pixels, can be formed using this method.

In some instances, multiple thermal transfer elements may be used to form a device or other object. The multiple thermal transfer elements may include thermal transfer elements with multicomponent transfer units and thermal transfer elements that transfer a single layer. For example, a device or other object may be formed using one or more thermal transfer elements with multicomponent transfer units and one or more thermal transfer elements that transfer a single layer.

One example of a suitable thermal transfer element 100 is illustrated in FIG. 1A. The thermal transfer element 100 includes a donor substrate 102, an optional primer layer 104, a light-to-heat conversion (LTHC) layer 106, an optional interlayer 108, an optional release layer 112, and a transfer layer 110. Directed light from a light-emitting source, such as a laser or lamp, can be used to illuminate the thermal transfer element 100 according to a pattern. The LTHC layer 106 contains a radiation absorber that converts light energy to heat energy. The conversion of the light energy to heat energy results in the transfer of a portion of the transfer layer 110 to a receptor (not shown).

Figure 1B:
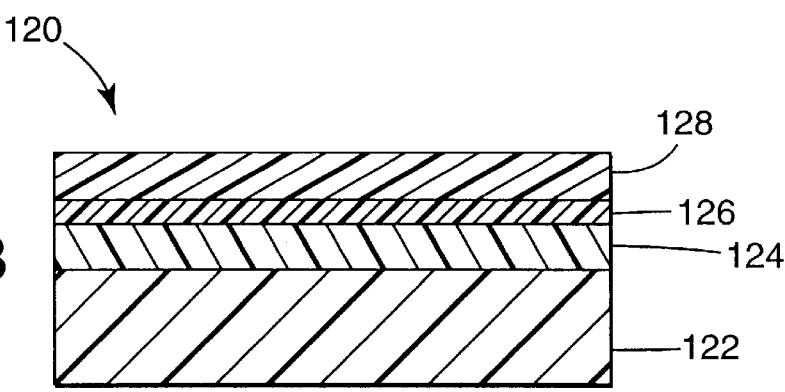
FIG. 1B is a schematic cross-section of a second example of a thermal transfer element according to the invention.
Figure 1C:
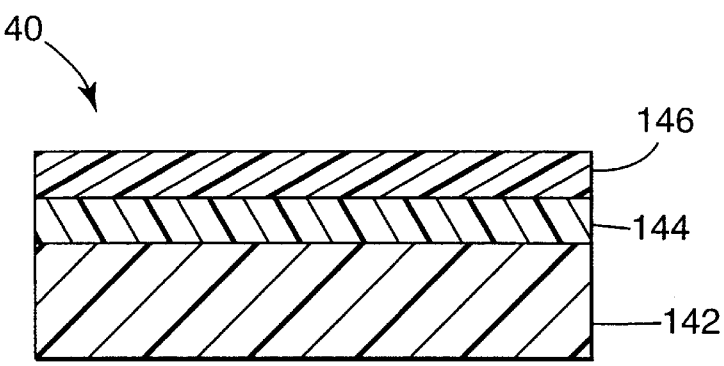
FIG. 1C is a schematic cross-section of a third example of a thermal transfer element according to the invention.
Figure 1D:
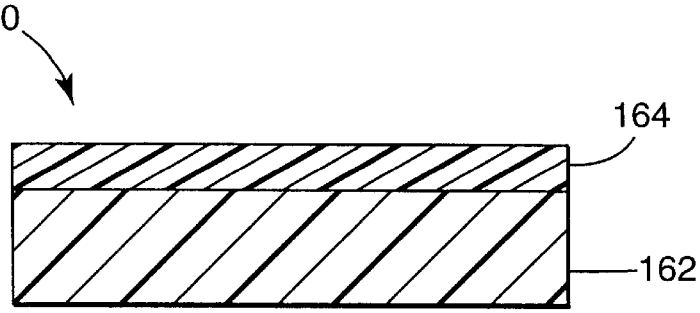
FIG. 1D is a schematic cross-section of a fourth example of a thermal transfer element according to the invention.

Another example of a thermal transfer element 120 includes a donor substrate 122, a LTHC layer 124, an interlayer 126, and a transfer layer 128, as illustrated in FIG. 1B. Another suitable thermal transfer element 140 includes a donor substrate 142, a LTHC layer 144, and a transfer layer 146, as illustrated in FIG. 1C. Yet another example of a thermal transfer element 160 includes a donor substrate 162 and a transfer layer 164, as illustrated in FIG. 1D, with an optional radiation absorber disposed in the donor substrate 162 and/or transfer layer 164 to convert light energy to heat energy. Alternatively, the thermal transfer element 160 may be used without a radiation absorber for thermal transfer of the transfer layer 164 using a heating element, such as a resistive heating element, that contacts the thermal transfer element to selectively heat the thermal transfer element and transfer the transfer layer according to a pattern. A thermal transfer element 160 without radiation absorber may optionally include a release layer, an interlayer, and/or other layers (e.g., a coating to prevent sticking of the resistive heating element) used in the art.

For thermal transfer using radiation (e.g., light), a variety of radiation-emitting sources can be used in the present invention. For analog techniques (e.g., exposure through a mask), high-powered light sources (e.g., xenon flash lamps and lasers) are useful. For digital imaging techniques, infrared, visible, and ultraviolet lasers are particularly useful. Suitable lasers include, for example, high power ($\geq 100$ mW) single mode laser diodes, fiber-coupled laser diodes, and diode-pumped solid state lasers (e.g., Nd:YAG and Nd:YLF). Laser exposure dwell times can be in the range from, for example, about 0.1 to 100 microseconds and laser fluences can be in the range from, for example, about 0.01 to about 1 J/cm$^2$.

When high spot placement accuracy is required (e.g. for high information full color display applications) over large substrate areas, a laser is particularly useful as the radiation source. Laser sources are compatible with both large rigid substrates such as 1 m×1 m×1.1 mm glass, and continuous or sheeted film substrates, such as 100 µm polyimide sheets.

Resistive thermal print heads or arrays may be used, for example, with simplified donor film constructions lacking a LTHC layer and radiation absorber. This may be particularly useful with smaller substrate sizes (e.g., less than approximately 30 cm in any dimension) or for larger patterns, such as those required for alphanumeric segmented displays.

Donor Substrate and Optional Primer Layer

The donor substrate can be a polymer film. One suitable type of polymer film is a polyester film, for example, polyethylene terephthalate or polyethylene naphthalate films. However, other films with sufficient optical properties (if light is used for heating and transfer), including high transmission of light at a particular wavelength, as well as sufficient mechanical and thermal stability for the particular application, can be used. The donor substrate, in at least some instances, is flat so that uniform coatings can be formed. The donor substrate is also typically selected from materials that remain stable despite heating of the LTHC layer. The typical thickness of the donor substrate ranges from 0.025 to 0.15 mm, preferably 0.05 to 0.1 mm, although thicker or thinner donor substrates may be used.

Typically, the materials used to form the donor substrate and the LTHC layer are selected to improve adhesion between the LTHC layer and the donor substrate. An optional priming layer can be used to increase uniformity during the coating of subsequent layers and also increase the interlayer bonding strength between the LTHC layer and the donor substrate. One example of a suitable substrate with primer layer is available from Teijin Ltd. (Product No. HPE100, Osaka, Japan).

Light-to-Heat Conversion (LTHC) Layer

For radiation-induced thermal transfer a light-to-heat conversion (LTHC) layer is typically incorporated within the thermal transfer element to couple the energy of light radiated from a light-emitting source into the thermal transfer element. The LTHC layer preferably includes a radiation absorber that absorbs incident radiation (e.g., laser light) and converts at least a portion of the incident radiation into heat to enable transfer of the transfer layer from the thermal transfer element to the receptor. In some embodiments, there is no separate LTHC layer and, instead, the radiation absorber is disposed in another layer of the thermal transfer element, such as the donor substrate or the transfer layer. In other embodiments, the thermal transfer element includes an LTHC layer and also includes additional radiation absorber(s) disposed in one or more of the other layers of the thermal transfer element, such as, for example, the donor substrate or the transfer layer. In yet other embodiments, the thermal transfer element does not include an LTHC layer or radiation absorber and the transfer layer is transferred using a heating element that contacts the thermal transfer element.

Typically, the radiation absorber in the LTHC layer (or other layers) absorbs light in the infrared, visible, and/or ultraviolet regions of the electromagnetic spectrum. The radiation absorber is typically highly absorptive of the selected imaging radiation, providing an optical density at the wavelength of the imaging radiation in the range of 0.2 to 3, and preferably from 0.5 to 2. Suitable radiation absorbing materials can include, for example, dyes (e.g., visible dyes, ultraviolet dyes, infrared dyes, fluorescent dyes, and radiation-polarizing dyes), pigments, metals, metal compounds, metal films, and other suitable absorbing materials. Examples of suitable radiation absorbers can include carbon black, metal oxides, and metal sulfides. One example of a suitable LTHC layer can include a pigment, such as carbon black, and a binder, such as an organic polymer. Another suitable LTHC layer can include metal or metal/metal oxide formed as a thin film, for example, black aluminum (i.e., a partially oxidized aluminum having a black visual appearance). Metallic and metal compound films may be formed by techniques, such as, for example, sputtering and evaporative deposition. Particulate coatings may be formed using a binder and any suitable dry or wet coating techniques.

Dyes suitable for use as radiation absorbers in a LTHC layer may be present in particulate form, dissolved in a binder material, or at least partially dispersed in a binder material. When dispersed particulate radiation absorbers are used, the particle size can be, at least in some instances, about 10 $\mu$m or less, and may be about 1 $\mu$m or less. Suitable dyes include those dyes that absorb in the IR region of the spectrum. Examples of such dyes may be found in Matsuoka, M., "Infrared Absorbing Materials", Plenum Press, New York, 1990; Matsuoka, M., *Absorption Spectra of Dyes for Diode Lasers*, Bunshin Publishing Co., Tokyo, 1990, U.S. Pat. Nos. 4,722,583; 4,833,124; 4,912,083; 4,942,141; 4,948,776; 4,948,778; 4,950,639; 4,940,640; 4,952,552; 5,023,229; 5,024,990; 5,156,938; 5,286,604; 5,340,699; 5,351,617; 5,360,694; and 5,401,607; European Patent Nos. 321,923 and 568,993; and Beilo, K. A. et al., *J. Chem. Soc., Chem. Commun.*, 1993, 452–454 (1993), all of which are herein incorporated by reference. IR absorbers marketed by Glendale Protective Technologies, Inc., Lakeland, Fla., under the designation CYASORB IR-99, IR-126 and IR-165 may also be used. A specific dye may be chosen based on factors such as, solubility in, and compatibility with, a specific binder and/or coating solvent, as well as the wavelength range of absorption.

Pigmentary materials may also be used in the LTHC layer as radiation absorbers. Examples of suitable pigments include carbon black and graphite, as well as phthalocyanines, nickel dithiolenes, and other pigments described in U.S. Pat. Nos. 5,166,024 and 5,351,617, incorporated herein by reference. Additionally, black azo pigments based on copper or chromium complexes of, for example, pyrazolone yellow, dianisidine red, and nickel azo yellow can be useful. Inorganic pigments can also be used, including, for example, oxides and sulfides of metals such as aluminum, bismuth, tin, indium, zinc, titanium, chromium, molybdenum, tungsten, cobalt, iridium, nickel, palladium, platinum, copper, silver, gold, zirconium, iron, lead, and tellurium. Metal borides, carbides, nitrides, carbonitrides, bronze-structured oxides, and oxides structurally related to the bronze family (e.g., $WO_{2.9}$) may also be used.

Metal radiation absorbers may be used, either in the form of particles, as described for instance in U.S. Pat. No. 4,252,671, incorporated herein by reference, or as films, as disclosed in U.S. Pat. No. 5,256,506, incorporated herein by reference. Suitable metals include, for example, aluminum, bismuth, tin, indium, tellurium and zinc.

As indicated, a particulate radiation absorber may be disposed in a binder. The weight percent of the radiation absorber in the coating, excluding the solvent in the calculation of weight percent, is generally from 1 wt. % to 30 wt. %, preferably from 3 wt. % to 20 wt. %, and most preferably from 5 wt. % to 15 wt. %, depending on the particular radiation absorber(s) and binder(s) used in the LTHC.

Suitable binders for use in the LTHC layer include film-forming polymers, such as, for example, phenolic resins (e.g., novolak and resole resins), polyvinyl butyral resins, polyvinyl acetates, polyvinyl acetals, polyvinylidene chlorides, polyacrylates, cellulosic ethers and esters, nitrocelluloses, and polycarbonates. Suitable binders may include monomers, oligomers, or polymers that have been or can be polymerized or crosslinked. In some embodiments, the binder is primarily formed using a coating of crosslinkable monomers and/or oligomers with optional polymer. When a polymer is used in the binder, the binder includes 1 to 50 wt. %, preferably, 10 to 45 wt. %, polymer (excluding the solvent when calculating wt. %).

Upon coating on the donor substrate, the monomers, oligomers, and polymers are crosslinked to form the LTHC. In some instances, if crosslinking of the LTHC layer is too low, the LTHC layer may be damaged by the heat and/or permit the transfer of a portion of the LTHC layer to the receptor with the transfer layer.

The inclusion of a thermoplastic resin (e.g., polymer) may improve, in at least some instances, the performance (e.g., transfer properties and/or coatability) of the LTHC layer. It is thought that a thermoplastic resin may improve the adhesion of the LTHC layer to the donor substrate. In one embodiment, the binder includes 25 to 50 wt. % (excluding the solvent when calculating weight percent) thermoplastic resin, and, preferably, 30 to 45 wt. % thermoplastic resin, although lower amounts of thermoplastic resin may be used (e.g., 1 to 15 wt. %). The thermoplastic resin is typically chosen to be compatible (i.e., form a one-phase combination) with the other materials of the binder. A solubility parameter can be used to indicate compatibility, *Polymer Handbook*, J. Brandrup, ed., pp. VII 519–557 (1989), incorporated herein by reference. In at least some embodiments, a thermoplastic resin that has a solubility parameter in the range of 9 to 13 $(ca/cm^3)^{1/2}$, preferably, 9.5 to 12 $(cal/cm^3)^{1/2}$, is chosen for the binder. Examples of suitable thermoplastic resins include polyacrylics, styrene-acrylic polymers and resins, and polyvinyl butyral.

Conventional coating aids, such as surfactants and dispersing agents, may be added to facilitate the coating process. The LTHC layer may be coated onto the donor substrate using a variety of coating methods known in the art. A polymeric or organic LTHC layer is coated, in at least some instances, to a thickness of 0.05 μm to 20 μm, preferably, 0.5 μm to 10 μm, and, most preferably, 1 μm to 7 μm. An inorganic LTHC layer is coated, in at least some instances, to a thickness in the range of 0.001 to 10 μm, and preferably, 0.002 to 1 μm.

This LTHC layer can be used in a variety of thermal transfer elements, including thermal transfer elements that have a multicomponent transfer unit and thermal transfer elements that are used to transfer a single layer of a device or other item. The LTHC layer can be used with thermal transfer elements that are useful in forming multilayer devices, as described above, as well as thermal transfer elements that are useful for forming other items. Examples include such items as color filters, spacer layers, black matrix layers, printed circuit boards, displays (for example, liquid crystal and emissive displays), polarizers, z-axis conductors, and other items that can be formed by thermal transfer including, for example, those described in U.S. Pat. Nos. 5,156,938; 5,171,650; 5,244,770; 5,256,506; 5,387, 496; 5,501,938; 5,521,035; 5,593,808; 5,605,780; 5,612, 165; 5,622,795; 5,685,939; 5,691,114; 5,693,446; and 5,710, 097 and PCT Patent Applications Nos. 98/03346 and 97/15173.

Interlayer

An optional interlayer may be used to minimize damage and contamination of the transferred portion of the transfer layer and may also reduce distortion in the transferred portion of the transfer layer. The interlayer may also influence the adhesion of the transfer layer to the rest of the thermal transfer element. Typically, the interlayer has high thermal resistance. Preferably, the interlayer does not distort or chemically decompose under the imaging conditions, particularly to an extent that renders the transferred image non-functional. The interlayer typically remains in contact with the LTHC layer during the transfer process and is not substantially transferred with the transfer layer.

Suitable interlayers include, for example, polymer films, metal layers (e.g., vapor deposited metal layers), inorganic layers (e.g., sol-gel deposited layers and vapor deposited layers of inorganic oxides (e.g., silica, titania, and other metal oxides)), and organic/inorganic composite layers. Organic materials suitable as interlayer materials include both thermoset and thermoplastic materials. Suitable thermoset materials include resins that may be crosslinked by heat, radiation, or chemical treatment including, but not limited to, crosslinked or crosslinkable polyacrylates, polymethacrylates, polyesters, epoxies, and polyurethanes. The thermoset materials may be coated onto the LTHC layer as, for example, thermoplastic precursors and subsequently crosslinked to form a crosslinked interlayer.

Suitable thermoplastic materials include, for example, polyacrylates, polymethacrylates, polystyrenes, polyurethanes, polysulfones, polyesters, and polyimides. These thermoplastic organic materials may be applied via conventional coating techniques (for example, solvent coating, spray coating, or extrusion coating). Typically, the glass transition temperature ($T_g$) of thermoplastic materials suitable for use in the interlayer is 25° C. or greater, preferably 50° C. or greater, more preferably 100° C. or greater, and, most preferably, 150° C. or greater. The interlayer may be either transmissive, absorbing, reflective, or some combination thereof, at the imaging radiation wavelength.

Inorganic materials suitable as interlayer materials include, for example, metals, metal oxides, metal sulfides, and inorganic carbon coatings, including those materials that are highly transmissive or reflective at the imaging light wavelength. These materials may be applied to the light-to-heat-conversion layer via conventional techniques (e.g., vacuum sputtering, vacuum evaporation, or plasma jet deposition).

The interlayer may provide a number of benefits. The interlayer may be a barrier against the transfer of material from the light-to-heat conversion layer. It may also modulate the temperature attained in the transfer layer so that thermally unstable materials can be transferred. The presence of an interlayer may also result in improved plastic memory in the transferred material.

The interlayer may contain additives, including, for example, photoinitiators, surfactants, pigments, plasticizers, and coating aids. The thickness of the interlayer may depend on factors such as, for example, the material of the interlayer, the material of the LTHC layer, the material of the transfer layer, the wavelength of the imaging radiation, and the duration of exposure of the thermal transfer element to imaging radiation. For polymer interlayers, the thickness of the interlayer typically is in the range of 0.05 μm to 10 μm, preferably, from about 0.1 μum to 4 μm, more preferably, 0.5 to 3 μm, and, most preferably, 0.8 to 2 μm. For inorganic interlayers (e.g., metal or metal compound interlayers), the thickness of the interlayer typically is in the range of 0.005 μm to 10 μm, preferably, from about 0.01 μm to 3 μm, and, more preferably, from about 0.02 to 1 μm.

Release Layer

The optional release layer typically facilitates release of the transfer layer from the rest of the thermal transfer element (e.g., the interlayer and/or the LTHC layer) upon heating of the thermal transfer element, for example, by a light-emitting source or a heating element. In at least some cases, the release layer provides some adhesion of the transfer layer to the rest of the thermal transfer element prior to exposure to heat. Suitable release layers include, for example, conducting and non-conducting thermoplastic polymers, conducting and non-conducting filled polymers, and/or conducting and non-conducting dispersions. Examples of suitable polymers include acrylic polymers, polyanilines, polythiophenes, poly(phenylenevinylenes), polyacetylenes, and other conductive organic materials, such as those listed in *Handbook of Conductive Molecules and Polymers*, Vols. 1–4, H. S. Nalwa, ed., John Wiley and Sons, Chichester (1997), incorporated herein by reference. Examples of suitable conductive dispersions include inks containing carbon black, graphite, ultrafine particulate indium tin oxide, ultrafine antimony tin oxide, and commercially available materials from companies such as Nanophase Technologies Corporation (Burr Ridge, Ill.) and Metech (Elverson, Pa.). Other suitable materials for the release layer include sublimable insulating materials and sublimable semiconducting materials (such as phthalocyanines), including, for example, the materials described in U.S. Pat. No. 5,747,217, incorporated herein by reference.

The release layer may be part of the transfer layer or a separate layer. All or a portion of the release layer may be transferred with the transfer layer. Alternatively, most or substantially all of the release layer remains with the donor substrate when the transfer layer is transferred. In some instances, for example, with a release layer including sublimable material, a portion of the release layer may be dissipated during the transfer process.

Transfer Layer

The transfer layer typically includes one or more layers for transfer to a receptor. These one or more layers may be formed using organic, inorganic, organometallic, and other materials. Although the transfer layer is described and illustrated as having discrete layers, it will be appreciated that, at least in some instances, there may be an interfacial region that includes at least a portion of each layer. This may occur, for example, if there is mixing of the layers or diffusion of material between the layers before, during, or after transfer of the transfer layer. In other instances, two layers may be completely or partially mixed before, during, or after transfer of the transfer layer. In any case, these structures will be referred to as including more than one independent layer, particularly if different functions of the device are performed by the different regions.

One example of a transfer layer includes a multicomponent transfer unit that is used to form a multilayer device, such as an active or passive device, on a receptor. In some cases, the transfer layer may include all of the layers needed for the active or passive device. In other instances, one or more layers of the active or passive device may be provided on the receptor, the rest of the layers being included in the transfer layer. Alternatively, one or more layers of the active or passive device may be transferred onto the receptor after the transfer layer has been deposited. In some instances, the transfer layer is used to form only a single layer of the active or passive device or a single or multiple layer of an item other than a device. One advantage of using a multicomponent transfer unit, particularly if the layers do not mix, is that the important interfacial characteristics of the layers in the multicomponent transfer unit can be produced when the thermal transfer unit is prepared and, preferably, retained during transfer. Individual transfer of layers may result in less optimal interfaces between layers.

The multilayer device formed using the multicomponent transfer unit of the transfer layer may be, for example, an electronic or optical device. Examples of such devices include electronic circuitry, resistors, capacitors, diodes, rectifiers, electroluminescent lamps, memory elements, field effect transistors, bipolar transistors, unijunction transistors, MOS transistors, metal-insulator-semiconductor transistors, charge coupled devices, insulator-metal-insulator stacks, organic conductor-metal-organic conductor stacks, integrated circuits, photodetectors, lasers, lenses, waveguides, gratings, holographic elements, filters (e.g., add-drop filters, gain-flattening filters, cut-off filters, and the like), mirrors, splitters, couplers, combiners, modulators, sensors (e.g., evanescent sensors, phase modulation sensors, interferometric sensors, and the like), optical cavities, piezoelectric devices, ferroelectric devices, thin film batteries, or combinations thereof Other electrically conductive devices that can be formed include, for example, electrodes and conductive elements.

Embodiments of the transfer layer include a multicomponent transfer unit that is used to form at least a portion of a passive or active device. As an example, in one embodiment, the transfer layer includes a multicomponent transfer unit that is capable of forming at least two layers of a multilayer device. These two layers of the multilayer device often correspond to two layers of the transfer layer. In this example, one of the layers that is formed by transfer of the multicomponent transfer unit is an active layer (i.e., a layer that acts as a conducting, semiconducting, superconducting, waveguiding, frequency multiplying, light producing (e.g., luminescing, light emitting, fluorescing, or phosphorescing), electron producing, or hole producing layer in the device and/or as a layer that produces an optical or electronic gain in the device.) A second layer that is formed by transfer of the multicomponent transfer unit is another active layer or an operational layer (i.e., a layer that acts as an insulating, conducting, semiconducting, superconducting, waveguiding, frequency multiplying, light producing (e.g., fluorescing or phosphorescing), electron producing, hole producing, light absorbing, reflecting, diffracting, phase retarding, scattering, dispersing, or diffusing layer in the device and/or as a layer that produces an optical or electronic gain in the device.) The multicomponent transfer unit may also be used to form additional active layers and/or operational layers, as well as, non-operational layers (i.e., layers that do not perform a function in the operation of the device, but are provided, for example, to facilitate transfer of a transfer unit to a receptor substrate and/or adhere the transfer unit to the receptor substrate.)

The transfer layer may include an adhesive layer disposed on an outer surface of the transfer layer to facilitate adhesion to the receptor. The adhesive layer may be an operational layer, for example, if the adhesive layer conducts electricity between the receptor and the other layers of the transfer layer, or a non-operational layer, for example, if the adhesive layer only adheres the transfer layer to the receptor. The adhesive layer may be formed using, for example, thermoplastic polymers, including conducting and non-conducting polymers, conducting and non-conducting filled polymers, and/or conducting and non-conducting dispersions. Examples of suitable polymers include acrylic polymers, polyanilines, polythiophenes, poly(phenylenevinylenes), polyacetylenes, and other conductive organic materials such as those listed in *Handbook of Conductive Molecules and Polymers*, Vols. 1–4, H. S. Nalwa, ed., John Wiley and Sons, Chichester (1997), incorporated herein by reference. Examples of suitable conductive dispersions include inks containing carbon black, graphite, ultrafine particulate indium tin oxide, ultrafine antimony tin oxide, and commercially available materials from companies such as Nanophase Technologies Corporation (Burr Ridge, Ill.) and Metech (Elverson, Pa.).

The transfer layer may also include a release layer disposed on the surface of the transfer layer that is in contact with the rest of the thermal transfer element. As described above, this release layer may partially or completely transfer with the remainder of the transfer layer or substantially all of the release layer may remain with the thermal transfer element upon transfer of the transfer layer. Suitable release layers are described above.

Although the transfer layer may be formed with discrete layers, it will be understood that, in at least some embodiments, the transfer layer may include layers that have multiple components and/or multiple uses in the device. It will also be understood that, at least in some embodiments, two or more discrete layers may be melted together during transfer or otherwise mixed or combined. In any case, these layers, although mixed or combined, will be referred to as individual layers.

Figure 2A:
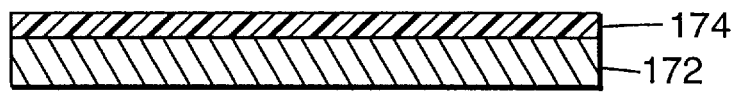
FIG. 2A is a schematic cross-section of a first example of a transfer layer, according to the invention, for use in any of the thermal transfer elements of FIGS. 1A to 1D.
Figure 2B:
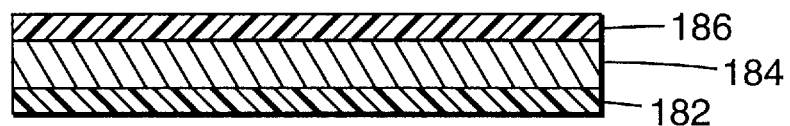
FIG. 2B is a schematic cross-section of a second example of a transfer layer, according to the invention, for use in any of the thermal transfer elements of FIGS. 1A to 1D.
Figure 2C:
FIG. 2C is a schematic cross-section of a third example of a transfer layer, according to the invention, for use in any of the thermal transfer elements of FIGS. 1A to 1D.
Figure 2D:
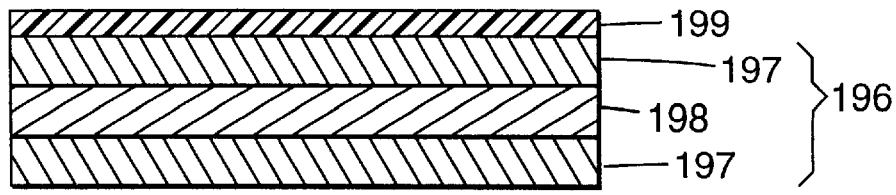
FIG. 2D is a schematic cross-section of a fourth example of a transfer layer, according to the invention, for use in any of the thermal transfer elements of FIGS. 1A to 1D.

One example of a transfer layer 170, illustrated in FIG. 2A, includes a conductive metal or metal compound layer 172 and a conductive polymer layer 174 for contact with a receptor (not shown). The conductive polymer layer 174 may also act, at least in part, as an adhesive layer to facilitate transfer to the receptor. A second example of a transfer layer 180, illustrated in FIG. 2B, includes a release layer 182, followed by a conductive metal or metal compound layer 184, and then a conductive or non-conductive polymer layer 186 for contact with a receptor (not shown). A third example of a transfer layer 190, illustrated in FIG. 2C, includes a conductive inorganic layer 191 (for example, vapor deposited indium tin oxide), a conductive or non-conductive polymer layer 192 for contact with a receptor, and an optional release layer (not shown). A fourth example of a transfer layer 195, illustrated in FIG. 2D, consists of a multilayer metal stack 196 of alternating metals 197, 198, such as gold-aluminum-gold, and a conductive or non-conductive polymer layer 199 for contact with a receptor.

Transfer Layer for an OEL Device

The transfer of a multicomponent transfer unit to form at least a portion of an OEL (organic electroluminescent) device provides an illustrative, non-limiting example of the formation of an active device using a thermal transfer element. In at least some instances, an OEL device includes a thin layer, or layers, of suitable organic materials sandwiched between a cathode and an anode. Electrons are injected into the organic layer(s) from the cathode and holes are injected into the organic layer(s) from the anode. As the injected charges migrate towards the oppositely charged electrodes, they may recombine to form electron-hole pairs which are typically referred to as excitons. These excitons, or excited state species, may emit energy in the form of light as they decay back to a ground state (see, for example, T. Tsutsui, *MRS Bulletin*, 22, 39–45 (1997), incorporated herein by reference).

Illustrative examples of OEL device constructions include molecularly dispersed polymer devices where charge carrying and/or emitting species are dispersed in a polymer matrix (see J. Kido "Organic Electroluminescent devices Based on Polymeric Materials", *Trends in Polymer Science*, 2, 350–355 (1994), incorporated herein by reference), conjugated polymer devices where layers of polymers such as polyphenylene vinylene act as the charge carrying and emitting species (see J. J. M. Halls et al., *Thin Solid Films*, 276, 13–20 (1996), herein incorporated by reference), vapor deposited small molecule heterostructure devices (see U.S. Pat. No. 5,061,569 and C. H. Chen et al., "Recent Developments in Molecular Organic Electroluminescent Materials", *Macromolecular Symposia*, 125, 1–48 (1997), herein incorporated by reference), light emitting electrochemical cells (see Q. Pei et al., *J. Amer. Chem. Soc.*, 118, 3922–3929 (1996), herein incorporated by reference), and vertically stacked organic light-emitting diodes capable of emitting light of multiple wavelengths (see U.S. Pat. No. 5,707,745 and Z. Shen et al., *Science*, 276, 2009–2011 (1997), herein incorporated by reference).

Figure 3A:
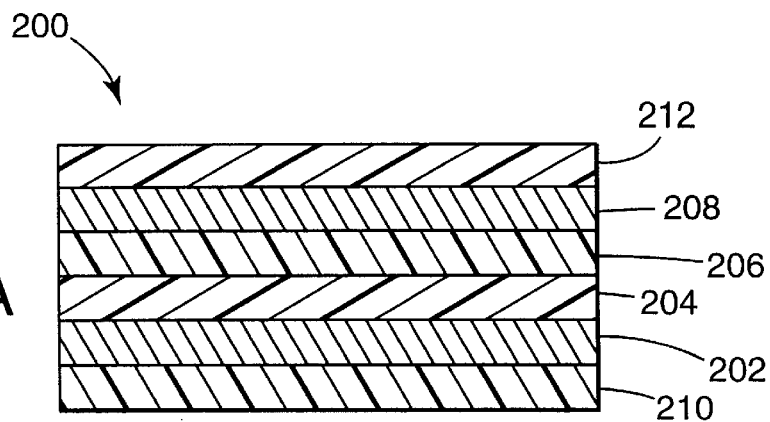
FIG. 3A is a schematic cross-section of an example of a transfer layer, according to the invention, for use in forming an organic electroluminescent device.
Figure 3B:
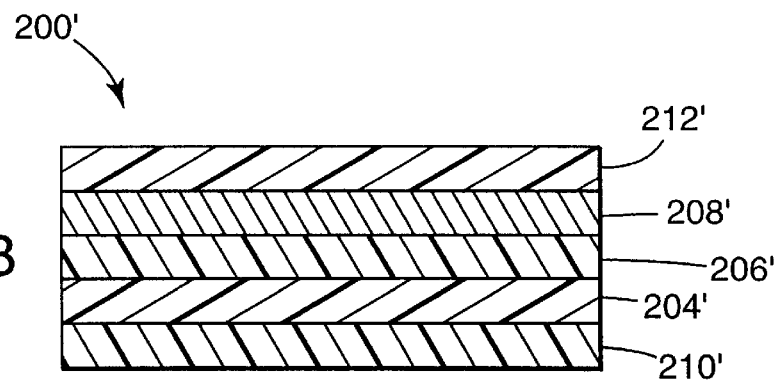
FIG. 3B is a schematic cross-section of a second example of a transfer layer, according to the invention, for use in forming an organic electroluminescent device.

One suitable example of a transfer layer 200 for forming an OEL device is illustrated in FIG. 3A. The transfer layer 200 includes an anode 202, a hole transport layer 204, an electron transport/emitter layer 206, and a cathode 208. Alternatively, either the cathode or anode can be provided separately on a receptor (e.g., as a conductive coating on the receptor) and not in the transfer layer. This is illustrated in FIG. 3B, for an anode-less transfer layer 200' using primed reference numerals to indicate layers in common with the transfer layer 200.

The transfer layer 200 may also include one or more layers, such as a release layer 210 and/or an adhesive layer 212, to facilitate the transfer of the transfer layer to the receptor. Either of these two layers can be conductive polymers to facilitate electrical contact with a conductive layer or structure on the receptor or conductive layer(s) formed subsequently on the transfer layer. It will be understood that the positions of the release layer and adhesive layer could be switched with respect to the other layers of the transfer layer.

The anode 202 and cathode 208 are typically formed using conducting materials such as metals, alloys, metallic compounds, metal oxides, conductive ceramics, conductive dispersions, and conductive polymers, including, for example, gold, platinum, palladium, aluminum, titanium, titanium nitride, indium tin oxide (ITO), fluorine tin oxide (FTO), and polyaniline. The anode 202 and the cathode 208 can be single layers of conducting materials or they can include multiple layers. For example, an anode or a cathode may include a layer of aluminum and a layer of gold or a layer of aluminum and a layer of lithium fluoride. For many applications, such as display applications, it is preferred that at least one of the cathode and anode be transparent to the light emitted by the electroluminescent device.

The hole transport layer 204 facilitates the injection of holes into the device and their migration towards the cathode 208. The hole transport layer 204 further acts as a barrier for the passage of electrons to the anode 202. The hole transport layer 204 can include, for example, a diamine derivative, such as N,N'-bis(3-methylphenyl)-N,N'-diphenylbenzidine (also known as TPD).

The electron transport/emitter layer 206 facilitates the injection of electrons and their migration towards the anode 202. The electron transport/emitter layer 206 further acts as a barrier for the passage of holes to the cathode 208. The electron transport/emitter layer 206 is often formed from a metal chelate compound, such as, for example, tris(8-hydroxyquinoline) aluminum (ALQ).

The interface between the hole transport layer 204 and electron transport/emitter layer 206 forms a barrier for the passage of holes and electrons and thereby creates a hole/electron recombination zone and provides an efficient organic electroluminescent device. When the emitter material is ALQ, the OEL device emits blue-green light. The emission of light of different colors may be achieved by the use of different emitters and dopants in the electron transport/emitter layer 206 (see C. H. Chen et al., "Recent Developments in Molecular Organic Electroluminescent Materials", *Macromolecular Symposia*, 125, 1–48 (1997), herein incorporated by reference).

Figure 4A:
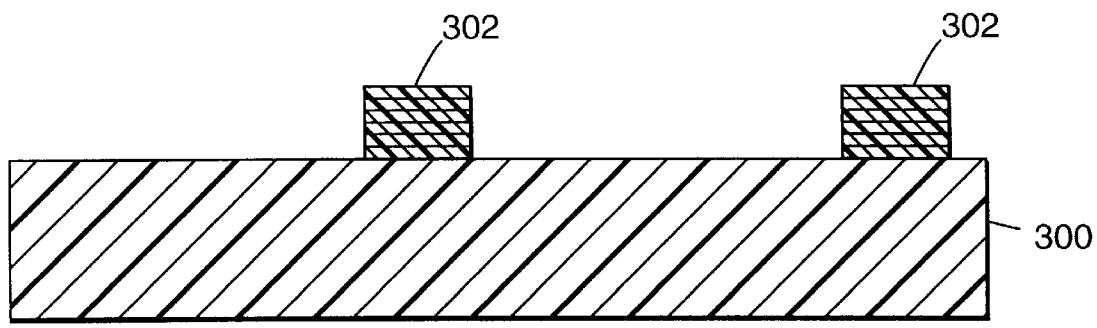
FIGS. 4A to 4C are cross-sectional views illustrating steps in one example of a process for forming a display device according to the invention.
Figure 4B:
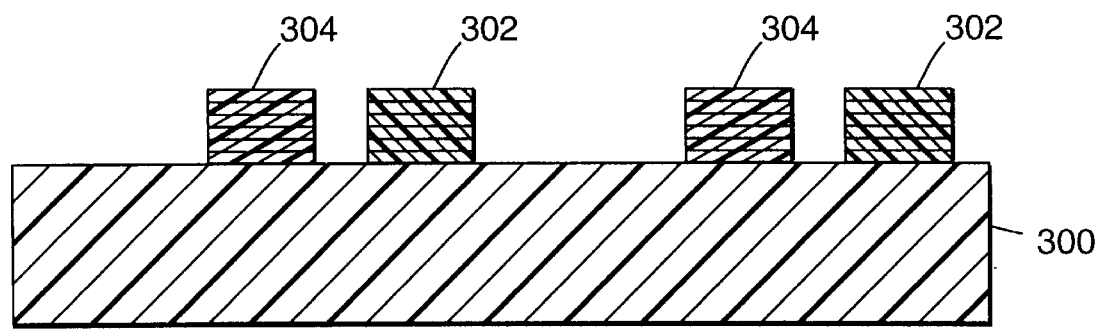
Figure 4C:
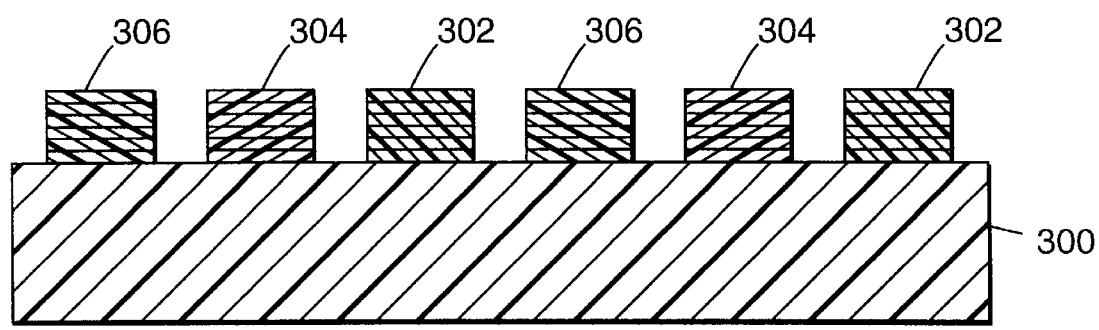

Other OEL multilayer device constructions may be transferred using different transfer layers. For example, the hole transporting layer 204 in FIG. 3A could also be an emitter layer and/or the hole transporting layer 204 and the electron transporting/emitter layer 206 could be combined into one layer. Furthermore, a separate emitter layer could be interposed between layers 204 and 206 in FIG. 3A The multilayer unit can be transferred onto a receptor to form OEL devices. As an example, an optical display can be formed as illustrated in FIGS. 4A through 4C. For example, green OEL devices 302 can be transferred onto the receptor substrate 300, as shown in FIG. 4A. Subsequently, blue OEL devices 304 and then red OEL devices 306 may be transferred, as shown in FIGS. 4B and 4C. Each of the green, blue, and red OEL devices 302, 304, 306 are transferred separately using green, blue, and red thermal transfer elements, respectively. Alternatively, the red, green, and blue thermal transfer elements could be transferred on top of one another to create a multi-color stacked OLED device of the type disclosed in U.S. Pat. No. 5,707,745, herein incorporated by reference. Another method for forming a full color device includes depositing columns of hole transport layer material and then sequentially depositing red, green, and blue electron transport layer/emitter multicomponent transfer units either parallel or perpendicular to the hole transport material. Yet another method for forming a full color device includes depositing red, green, and blue color filters (either conventional transmissive filters, fluorescent filters, or phosphors) and then depositing multicomponent transfer units corresponding to white light or blue light emitters.

After formation, the OEL device is typically coupled to a driver (not shown) and sealed to prevent damage. The thermal transfer element can be a small or a relatively large sheet coated with the appropriate transfer layer. The use of laser light or other similar light-emitting sources for transferring these devices permits the formation of narrow lines and other shapes from the thermal transfer element. A laser or other light source could be used to produce a pattern of the transfer layer on the receptor, including receptors that may be meters in length and width.

This example illustrates advantages of using the thermal transfer elements. For example, the number of processing steps can be reduced as compared to conventional photolithography methods because many of the layers of each OEL device are transferred simultaneously, rather than using multiple etching and masking steps. In addition, multiple devices and patterns can be created using the same imaging hardware. Only the thermal transfer element needs to be changed for each of the different devices 302, 304, 306.

Transfer Layer for a Field Effect Transistor

A field effect transistor (FET) can be formed using one or more thermal transfer elements. One example of an organic field effect transistor that could be formed using thermal transfer elements is described in Garnier, et al., *Adv. Mater.* 2, 592–594 (1990), incorporated herein by reference.

Field effect transistors are, in general, three terminal electronic devices capable of modulating the current flow between two terminals (source and drain) with the application of an electric field at the remaining terminal (gate) (see, for example, S. M. Sze, *Physics of Semiconductor Devices*, $2^{nd}$ Ed. Wiley, New York, 431–435 (1981), incorporated herein by reference). In one representative construction, a field effect transistor consists of a rectangular slab of semiconducting material bounded on opposite ends with two electrodes - the source and drain electrodes. On one of the other surfaces an insulating layer (gate dielectric) and subsequent electrode (gate electrode) are formed. An electric field is applied between the gate electrode and the semiconductor slab. The conductivity, and therefore current flow, between the source and drain electrodes is controlled by the polarity and strength of the gate-insulator-semiconductor field.

It is also possible to construct a field effect transistor without a gate insulator. Field effect transistors can be assembled with a gate electrode/semiconductor rectifying region. The conductivity between the source and drain electrodes is modulated by varying the polarity and strength of the gate/semiconductor field which controls the depletion region at the gate/semiconductor interface. This type of construction is typically referred to as a MESFET or JFET, metal semiconductor FET or Junction FET respectively (see, for example, S. M. Sze, *Physics of Semiconductor Devices*, $2^{nd}$ Ed. Wiley, New York, 312–324 (1981), incorporated herein by reference).

Material selection for the metal electrodes, gate dielectric and semiconductor may be influenced several parameters including conductivity, reliability, electron affinity, fermi level, processing compatibility, device application, and cost. For example, in general, it is advantageous to select a metal with a low work function to form an electrical contact with an n-type (electron conducting) semiconductor.

Figure 5A:
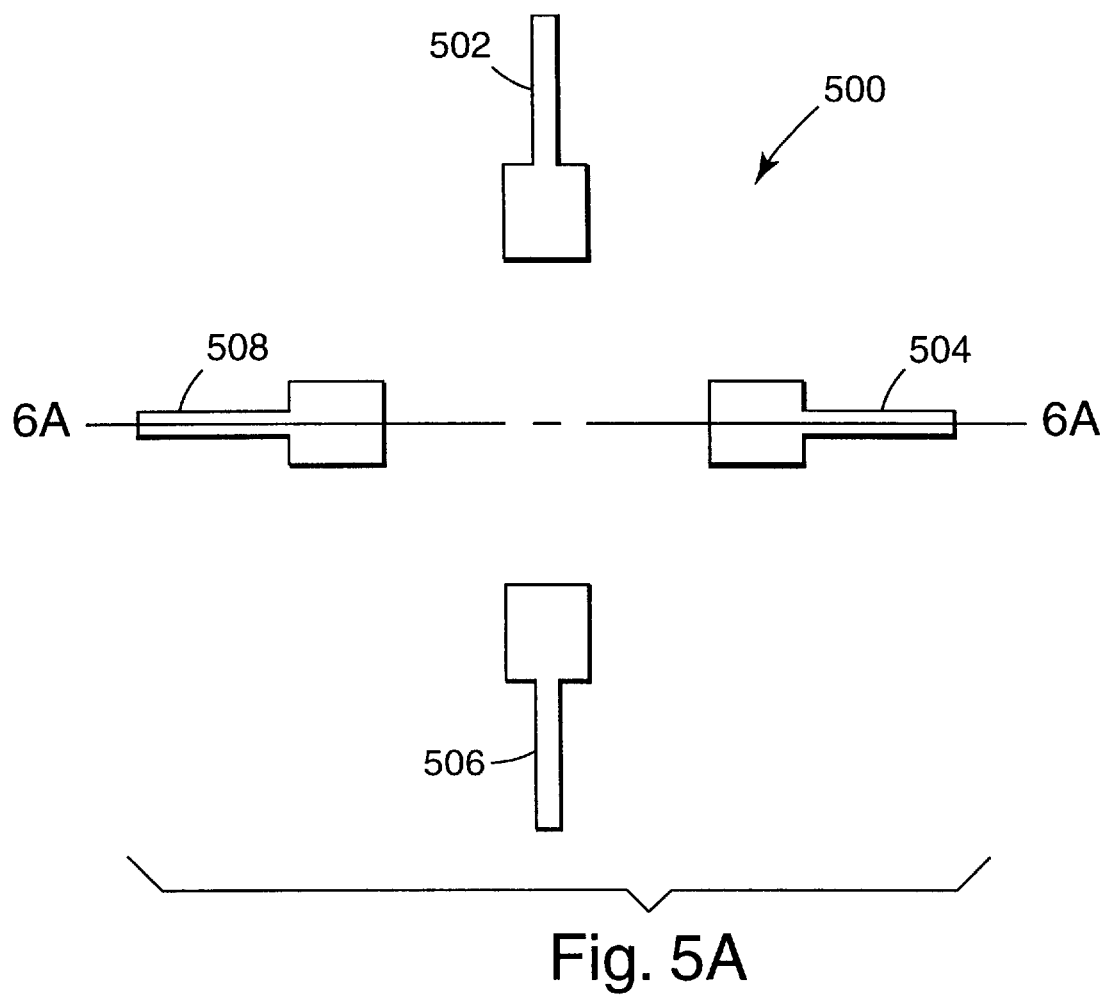
FIGS. 5A to 5D are top views illustrating steps in one example of a process for forming a field effect transistor according to the invention.
Figure 6A:
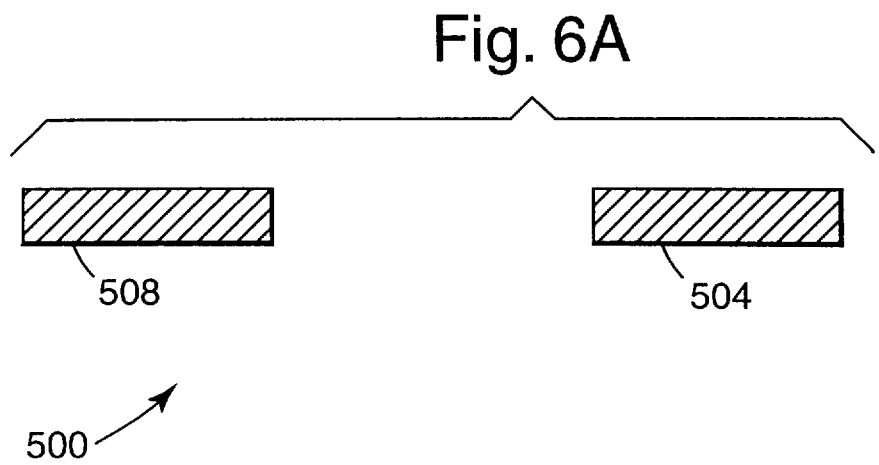
FIGS. 6A to 6D are cross-sectional views corresponding to FIGS. 5A to 5D, respectively, and illustrating steps in the one example of a process for forming a field effect transistor.

An example of the formation of a field effect transistor is illustrated in FIGS. 4A to 4D and 5A to 5D. The field effect transistor is formed on a receptor substrate 500 upon which electrical contacts 502, 504, 506, 508 have been formed, as illustrated in FIGS. 4A and 5A. The receptor substrate 500 is typically formed from a non-conducting material, such as glass or a non-conducting plastic or the receptor substrate 500 is covered with a non-conductive coating. The electrical contacts 502, 504, 506, 508 can be formed using a metal or a metallic compound, such as gold, silver, copper, or indium tin oxide. The electrical contacts 502, 504, 506, 508 can also be formed using a conducting organic material such as polyaniline. The electrical contacts 502, 504, 506, 508 can be formed by a variety of techniques including photolithography or thermal transfer utilizing a thermal transfer element with a transfer layer of the particular metal, metallic compound, or conducting organic material.

Figure 5B:
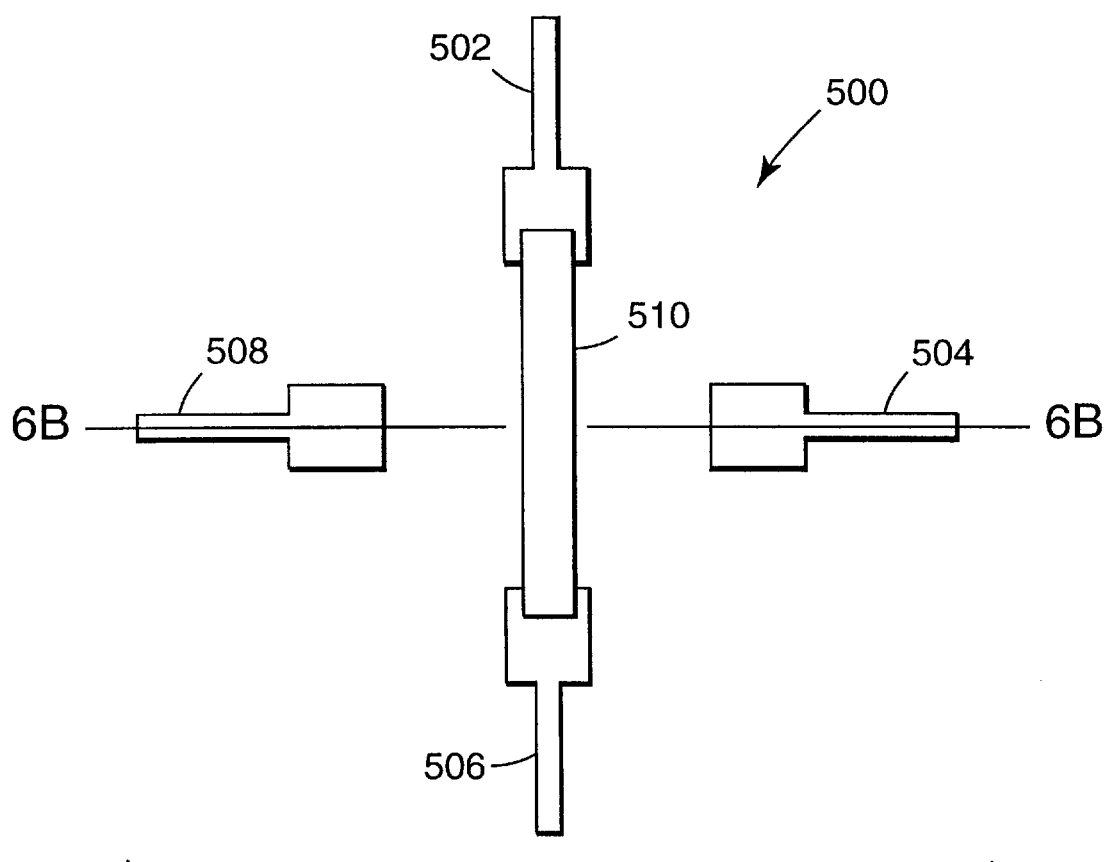
Figure 6B:
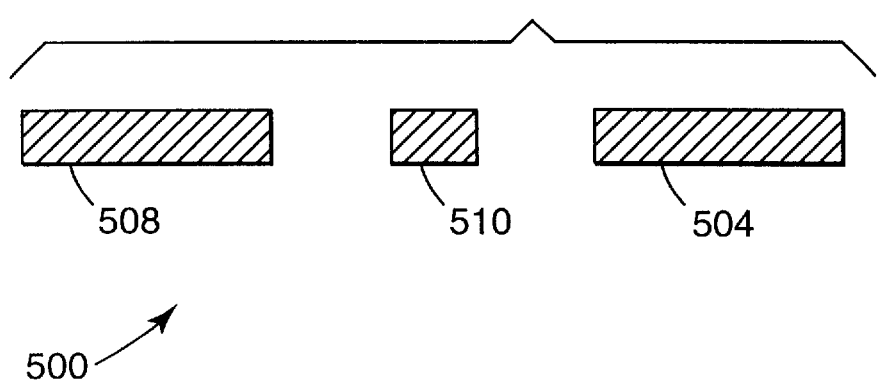

A gate electrode 510 is formed between two opposing electrodes 502, 506, as illustrated in FIGS. 4B and 5B. The gate electrode 510 can be formed using a first thermal transfer element with a transfer layer including the material chosen for the gate electrode. Suitable materials for the gate electrode include metals, metallic compounds, conducting polymers, filled polymers, and conducting inks. Examples of materials for the gate electrode include gold, silver, platinum, carbon, indium tin oxide, polyaniline, and carbon black filled polymers.

Figure 5C:
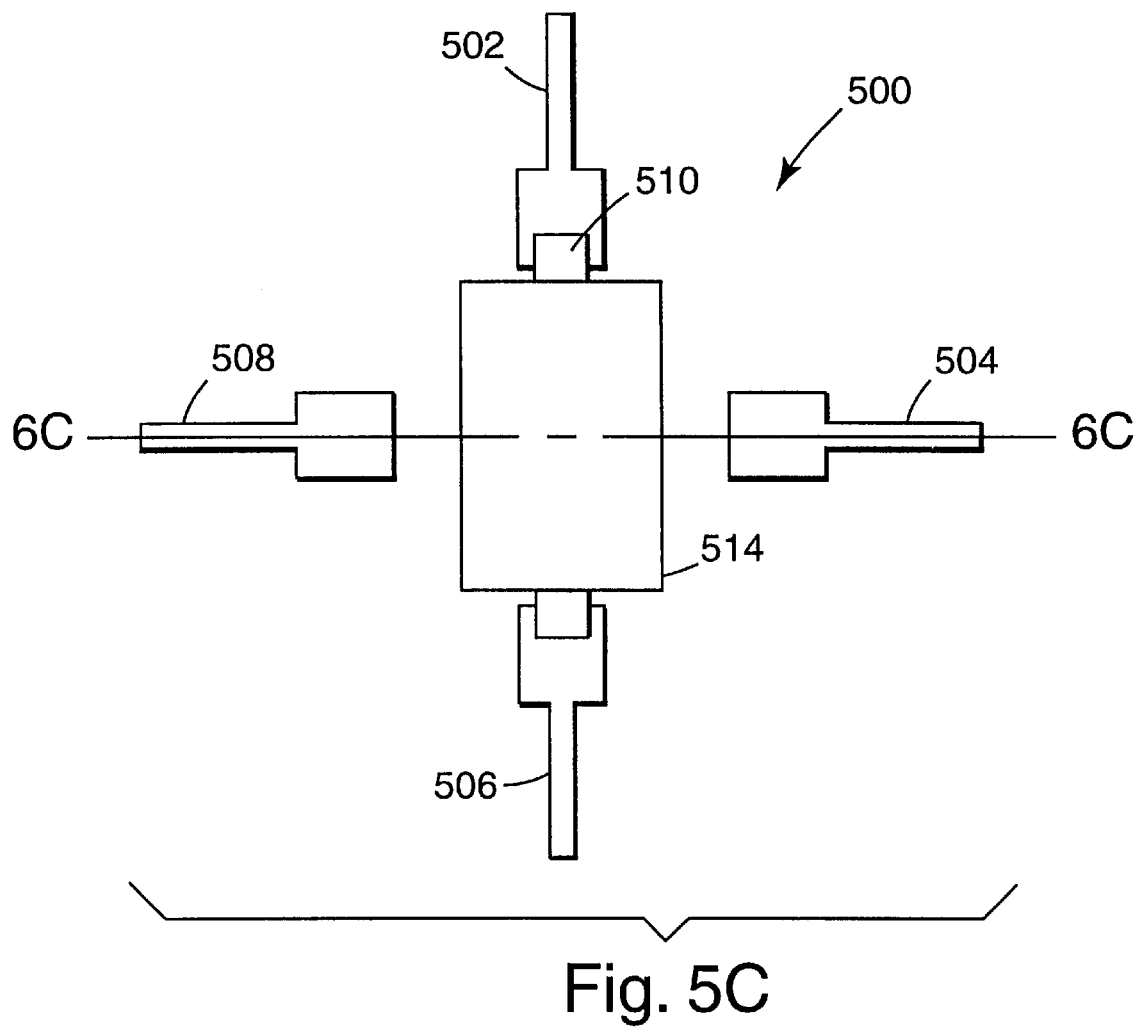
Figure 6C:
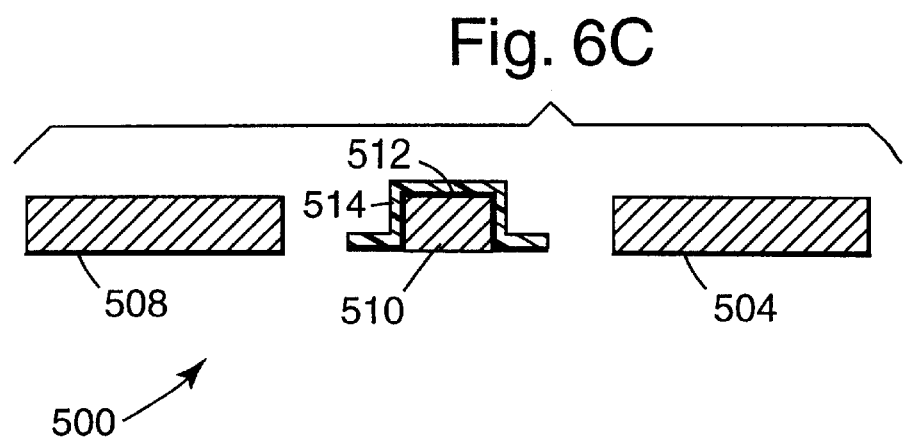

A gate insulating layer 512 and a semiconductor layer 514 are formed over the gate electrode 510, as shown in FIGS. 4C and 5C. These two layers 512, 514 can be formed using a second thermal transfer element that includes, for example, a multicomponent transfer unit with an insulating layer and a semiconductor layer. The gate insulating layer 512 can be formed using organic or inorganic insulators, such as silicon dioxide, silicon nitride, tantalum oxide, other inorganic oxides, polyimides, polyamic acids, acrylics, cyanoethylpullulan, and magnesium fluoride. The organic polymers used as gate insulating layers may be filled with an insulating material such as ultrafine silica particles.

The semiconductor layer 514 can be formed using organic and inorganic semiconductors, such as polythiophenes, oligomeric thiophenes, polyphenylvinylenes, polyacetylenes, metallophthalocyanines, and amorphous and polycrystalline silicon and germanium.

Figure 5D:
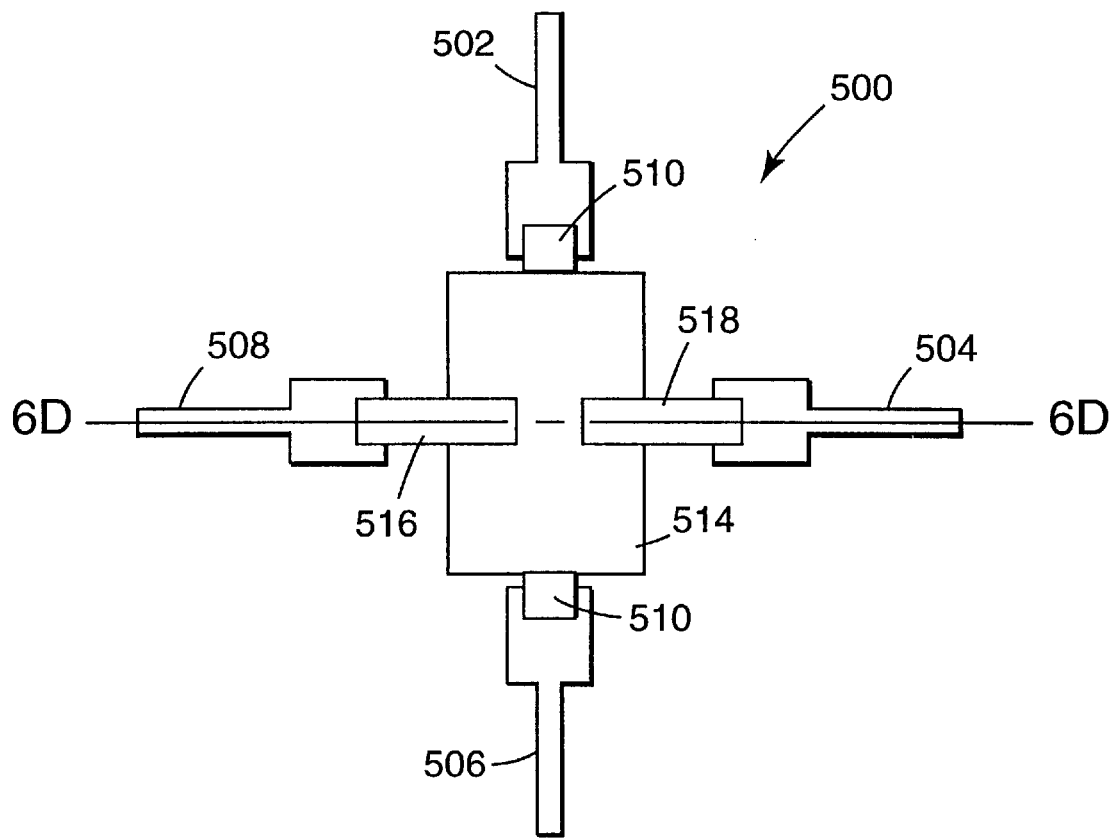
Figure 6D:
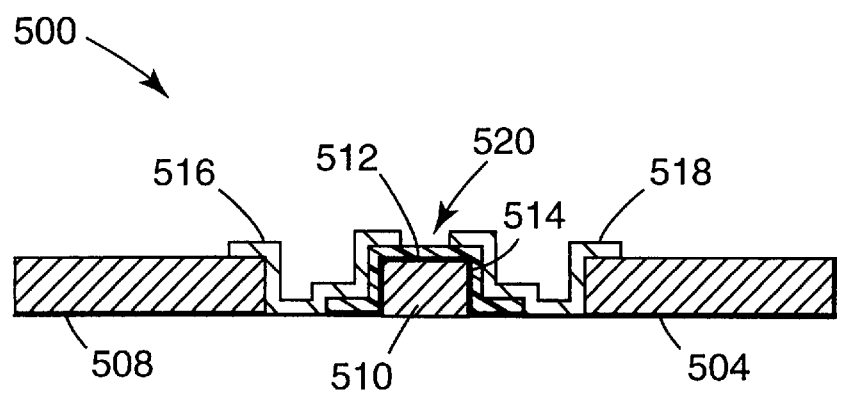

Finally, source and drain contacts 516, 518 can be formed using conductive material, such as a metal, metallic compound, conducting polymer, conducting ink, or conducting organic material as described above to make two spaced apart connections between the semiconducting layer 514 and opposing electrical contacts 504, 508, respectively, as shown in FIGS. 4D and 5D. The region 520 between the source and drain contacts 516, 518 forms a channel of the field effect transistor. The source and drain contacts 516, 518 can be formed using a third thermal transfer layer including a transfer layer with a layer of the appropriate conductive material. It will be recognized that in many field effect transistors, the identity of the source and drain can be interchanged from the device illustrated in FIG. 4D and 5D.

Figure 7:
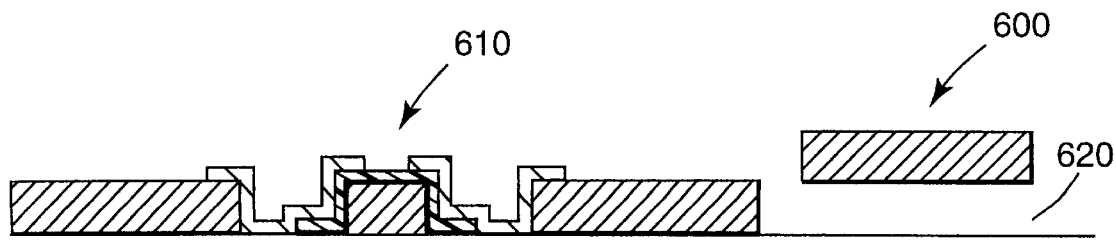
FIG. 7 is a cross-sectional view of a coupled field effect transistor and organic electroluminescent device, according to the invention.

An OEL device 600 and field effect transistor 610 can be combined, for example, where one of the electrical contacts of the transistor is also the anode or cathode 620 of the OEL device, as shown in FIG. 7. This combination allows the field effect transistor to control the operation of the OEL device. A display unit with this combination can be made using, for example, three or more thermal transfer elements to form the field effect transistor and at least one additional thermal transfer element to form the OEL device, as described above.

Transfer Layer for an Optical Waveguide

Optical waveguides typically include a core of material that is substantially transparent to light of the wavelength of interest. The core is covered by a cladding material that is also is substantially transparent to the light of the wavelength of interest. The light is transmitted through, and substantially confined in, the core of the waveguide by total internal reflectance caused by the difference in the index of refraction between the core and the cladding. Typically, the index of refraction of the core is slightly greater than the index of refraction of the cladding. The performance of a waveguide is influenced by many factors such as, for example, the shape, length, and transparency of the waveguide and the difference in refractive index between the core and the cladding. Typically, a difference in refractive index between the core and the cladding of 0.002 to 0.5 is desirable. These variables can be manipulated by those skilled in the art to fabricate waveguides with performance optimized for their intended use. Core and cladding materials that are useful in forming waveguides include glass and organic polymers.

Conventionally, optical waveguides are manufactured by a variety of methods, such as photolithography, diffusion, and ion implantation processes. For example, a conventional waveguide can be manufactured by applying a suitable optical material onto a substrate, typically in a sandwich form, resulting in a core region surrounded by a cladding region. A photoresist material is then applied onto the sandwich and patterned by a photolithographic process. The pattern defined by the photolithographic process is then transferred to the waveguide sandwich by an etching process. The substrate with the etched pattern is then cleaned, which removes the remaining photoresist and leaves the resultant waveguide on the substrate.

An optical waveguide can be formed using one or more thermal transfer elements. For example, thermal transfer using thermal transfer element 100 in FIG. 1A wherein transfer layer 110 comprises three layers of polymers of suitable indices of refraction could be used to form a waveguide on a receptor substrate. Since it forms the core of the waveguide, the central polymer layer of the transfer layer typically has an index of refraction slightly greater than the outer two layers. Examples of core/cladding combinations include, but are not limited to, polyetherimide/benzocyclobutene, polycarbonate/fluorinated acrylic, polycarbonate/polymethylmethacrylate and fluorinated polyimide/polymethylmethacrylate.

Thermal transfer of portions of an optical waveguide using a thermal transfer element may also be utilized to form an optical waveguide. For example, a receptor substrate could be coated with a cladding polymer such as polymethylmethacrylate by conventional methods or by a separate thermal transfer element and thermal transfer step. Subsequent thermal transfer of a polymethylmethacrylate/polycarbonate bilayer to the receptor substrate forms a waveguide having a polycarbonate core and polymethylmethacrylate cladding.

Receptor

The receptor substrate may be any item suitable for a particular application including, but not limited to, transparent films, display black matrices, passive and active portions of electronic displays, metals, semiconductors, glass, various papers, and plastics. Non-limiting examples of receptor substrates which can be used in the present invention include anodized aluminum and other metals, plastic films (e.g., polyethylene terephthalate, polypropylene), indium tin oxide coated plastic films, glass, indium tin oxide coated glass, flexible circuitry, circuit boards, silicon or other semiconductors, and a variety of different types of paper (e.g., filled or unfilled, calendered, or coated). Various layers (e.g., an adhesive layer) may be coated onto the receptor substrate to facilitate transfer of the transfer layer to the receptor substrate. Other layers may be coated on the receptor substrate to form a portion of a multilayer device.

For example, an OEL or other electronic device may be formed using a receptor substrate having a metal anode or cathode formed on the receptor substrate prior to transfer of the transfer layer from the thermal transfer element. This metal anode or cathode may be formed, for example, by deposition of a conductive layer on the receptor substrate and patterning of the layer into one or more anodes or cathodes using, for example, photolithographic techniques.

Operation

During imaging, the thermal transfer element is typically brought into intimate contact with a receptor. In at least some instances, pressure or vacuum are used to hold the thermal transfer element in intimate contact with the receptor. A radiation source is then used to heat the LTHC layer (and/or other layer(s) containing radiation absorber) in an imagewise fashion (e.g., digitally or by analog exposure through a mask) to perform imagewise transfer of the transfer layer from the thermal transfer element to the receptor according to a pattern.

Alternatively, a heating element, such as a resistive heating element, may be used to transfer the multicomponent transfer unit. The thermal transfer element is selectively contacted with the heating element to cause thermal transfer of a portion of the transfer layer according to a pattern. In another embodiment, the thermal transfer element may include a layer that can convert an electrical current applied to the layer into heat.

Typically, the transfer layer is transferred to the receptor without transferring any of the other layers of the thermal transfer element, such as the optional interlayer and the LTHC layer. The presence of the optional interlayer may eliminate or reduce the transfer of the LTHC layer to the receptor and/or reduce distortion in the transferred portion of the transfer layer. Preferably, under imaging conditions, the adhesion of the interlayer to the LTHC layer is greater than the adhesion of the interlayer to the transfer layer. In some instances, a reflective interlayer can be used to attenuate the level of imaging radiation transmitted through the interlayer and reduce any damage to the transferred portion of the transfer layer that may result from interaction of the transmitted radiation with the transfer layer and/or the receptor. This is particularly beneficial in reducing thermal damage which may occur when the receptor is highly absorptive of the imaging radiation.

During laser exposure, it may be desirable to minimize formation of interference patterns due to multiple reflections from the imaged material. This can be accomplished by various methods. The most common method is to effectively roughen the surface of the thermal transfer element on the scale of the incident radiation as described in U.S. Pat. No. 5,089,372. This has the effect of disrupting the spatial coherence of the incident radiation, thus minimizing self interference. An alternate method is to employ an antireflection coating within the thermal transfer element. The use of anti-reflection coatings is known, and may consist of quarter-wave thicknesses of a coating such as magnesium fluoride, as described in U.S. Pat No. 5,171,650, incorporated herein by reference.

Large thermal transfer elements can be used, including thermal transfer elements that have length and width dimensions of a meter or more. In operation, a laser can be rastered or otherwise moved across the large thermal transfer element, the laser being selectively operated to illuminate portions of the thermal transfer element according to a desired pattern. Alternatively, the laser may be stationary and the thermal transfer element moved beneath the laser.

In some instances, it may be necessary, desirable, and/or convenient to sequentially use two or more different thermal transfer elements to form a device. For example, one thermal transfer element may be used to form a gate electrode of a field effect transistor and another thermal transfer element may be used to form the gate insulating layer and semiconducting layer, and yet another thermal transfer layer may be used to form the source and drain contacts. A variety of other combinations of two or more thermal transfer elements can be used to form a device, each thermal transfer element forming one or more layers of the device. Each of these thermal transfer elements may include a multicomponent transfer unit or may only include a single layer for transfer to the receptor. The two or more thermal transfer units are then sequentially used to deposit one or more layers of the device. In some instances, at least one of the two or more thermal transfer elements includes a multicomponent transfer unit.

EXAMPLES

Unless otherwise indicated, chemicals were obtained from Aldrich Chemical Company (Milwaukee, Wis.). All of the vacuum deposited materials were thermally evaporated and deposited at room temperature. The deposition rate and thickness of each vacuum deposited layer was monitored with a quartz crystal microbalance (Leybold Inficon Inc., East Syracuse, N.Y.). The background pressure (chamber pressure prior to the deposition) was roughly $\times 10^{-5}$ torr ($1.3 \times 10^{-3}$ Pa).

The laser transfer system included a CW Nd:YAG laser, acousto-optic modulator, collimating and beam expanding optics, an optical isolator, a linear galvonometer and an f-theta scan lens. The Nd:YAG laser was operating in the TEM 00 mode, and produced a total power of 7.5 Watts. Scanning was accomplished with a high precision linear galvanometer (Cambridge Technology Inc., Cambridge, Mass.). The laser was focused to a Gaussian spot with a measured diameter of 140 μm at the $1/e^2$ intensity level. The spot was held constant across the scan width by utilizing an f-theta scan lens. The laser spot was scanned across the image surface at a velocity of 5.6 meters/second. The f-theta scan lens held the scan velocity uniform to within 0.1%, and the spot size constant to within ±3 microns.

Example 1

Preparation of a Substrate/LTHC/Interlayer Element

A carbon black light-to-heat conversion layer was prepared by coating the following LTHC Coating Solution, according to Table 1, onto a 0.1 mmn PET substrate with a Yasui Seiki Lab Coater, Model CAG-150 (Yasui Seiki Co., Bloomington, Ind.) using a microgravure roll of 381 helical cells per lineal cm (150 helical cells per lineal inch).

TABLE 1

LTHC Coating Solution

| Component | Parts by Weight |
|---|---|
| Raven ™ 760 Ultra carbon black pigment (available from Columbian Chemicals, Atlanta, GA) | 3.39 |
| Butvar ™ B-98 (polyvinylbutyral resin, available from Monsanto, St. Louis, MO) | 0.61 |
| Joncryl ™ 67 (acrylic resin, available from S.C. Johnson & Son, Racine, WI) | 1.81 |
| Elvacite ™ 2669 (acrylic resin, available from ICI Acrylics, Wilmington, DE) | 9.42 |

TABLE 1-continued

LTHC Coating Solution

| Component | Parts by Weight |
|---|---|
| Disperbyk ™ 161 (dispersing aid, available from Byk Chemie, Wallingford, CT) | 0.3 |
| FC-430 ™ (fluorochemical surfactant, available from 3M, St. Paul, MN) | 0.012 |
| Ebecryl ™ 629 (epoxy novolac acrylate, available from UCB Radcure, N. Augusta, SC) | 14.13 |
| Irgacure ™ 369 (photocuring agent, available from Ciba Specialty Chemicals, Tarrytown, NY) | 0.95 |
| Irgacure ™ 184 (photocuring agent, available from Ciba Specialty Chemicals, Tarrytown, NY) | 0.14 |
| propylene glycol methyl ether acetate | 16.78 |
| 1-methoxy-2-propanol | 9.8 |
| methyl ethyl ketone | 42.66 |

The coating was in-line dried at 40° C. and UV-cured at 6.1 m/min using a Fusion Systems Model 1600 (400 W/in) UV curing system fitted with H-bulbs (Fusion UV Systems, Inc., Gaithersburg, Md.). The dried coating had a thickness of approximately 3 microns.

Onto the carbon black coating of the light-to-heat conversion layer was rotogravure coated an Interlayer Coating Solution, according to Table 2, using the Yasui Seiki Lab Coater, Model CAG-150 (Yasui Seiki Co., Bloomington, Ind.). This coating was in-line dried (40° C.) and UV-cured at 6.1 m/min using a Fusion Systems Model 1600 (600 W/in) fitted with H-bulbs. The thickness of the resulting interlayer coating was approximately 1.7 microns.

TABLE 2

Interlayer Coating Solution

| Component | Parts by Weight |
|---|---|
| Butvar ™ B-98 | 0.98 |
| Joncryl ™ 67 | 2.95 |
| Sartomer ™ SR351 ™ (trimethylolpropane triacrylate, available from Sartomer, Exton, PA) | 15.75 |
| Irgacure ™ 369 | 1.38 |
| Irgacure ™ 184 | 0.2 |
| 1-methoxy-2-propanol | 31.5 |
| methyl ethyl ketone | 47.24 |

Example 2

Preparation of another Substrate/LTHC/Interlayer Element

A carbon black light-to-heat conversion layer was prepared by coating the following LTHC Coating Solution, according to Table 3, onto a 0.1 mm PET substrate with a Yasui Seiki Lab Coater, Model CAG-150 (Yasui Seiki Co., Bloomington, Ind.) using a microgravure roll of 228.6 helical cells per lineal cm (90 helical cells per lineal inch).

TABLE 3

LTHC Coating Solution

| Component | Parts by Weight |
|---|---|
| Raven ™ 760 Ultra carbon black pigment (available from Columbian Chemicals, Atlanta, GA) | 3.78 |
| Butvar ™ B-98 (polyvinylbutyral resin, available from Monsanto, St. Louis, MO) | 0.67 |
| Joncryl ™ 67 (acrylic resin, available from S.C. Johnson & Son, Racine, WI) | 2.02 |
| Disperbyk ™ 161 (dispersing aid, available from Byk Chemie, Wallingford, CT) | 0.34 |
| FC-430 ™ (fluorochemical surfactant, available from 3M, St. Paul, MN) | 0.01 |
| SR 351 ™ (trimethylolpropane triacrylate, available from Sartomer, Exton, PA) | 22.74 |
| Duracure ™ 1173 (2-hydroxy-2-methyl-1-phenyl-1-propanone photoinitiator, available from Ciba, Hawthorne, NY) | 1.48 |
| 1-methoxy-2-propanol | 27.59 |
| methyl ethyl ketone | 41.38 |

The coating was in-line dried at 40° C. and UV-cured at 6.1 m/min using a Fusion Systems Model 1600 (400 W/in) UV curing system fitted with H-bulbs. The dried coating had a thickness of approximately 3 microns.

Onto the carbon black coating of the light-to-heat conversion layer was rotogravure coated an Interlayer Coating Solution, according to Table 4, using the Yasui Seiki Lab Coater, Model CAG-150 (Yasui Seiki Co., Bloomington, Ind.). This coating was in-line dried (40° C.) and UV-cured at 6.1 m/min using a Fusion Systems Model 1600 (600 W/in) fitted with H-bulbs. The thickness of the resulting interlayer coating was approximately 1.7 microns.

TABLE 4

Interlayer Coating Solution

| Component | Parts by Weight |
|---|---|
| Butvar ™ B-98 | 0.99 |
| Joncryl ™ 67 | 2.97 |
| SR 351 ™ | 15.84 |
| Duracure ™ 1173 | 0.99 |
| 1-methoxy-2-propanol | 31.68 |
| methyl ethyl ketone | 47.52 |

Example 3

Transfer of a Polymer/Gold/Polymer Film

A thermal donor element with a multicomponent transfer layer was prepared by applying coatings to the substrate/LTHC/interlayer element of Example 2. A coating of acrylic polymer (Elvacite™ 2776, ICI Acrylics, Wilmington, Del.) was applied to the interlayer of the thermal transfer element using a 5 wt. % aqueous solution of polymer with a #6 Mayer bar. The coating was dried at about 60° C. for about 5 minutes. A 500 Å coating of gold was then vacuum deposited over the acrylic polymer. Another coating of acrylic polymer (Elvacite™ 2776, ICI Acrylics) was coated over the gold layer by applying a 5 wt. % aqueous solution of polymer with a #6 Mayer bar. The coating was dried at about 60° C. for about 5 minutes. The sample was imaged onto a glass receptor using a linear scan speed of 5.6 m/s. The result was a uniform transfer of the polymer/gold/polymer transfer layer as 70 micron wide lines with excellent edge uniformity.

Example 4

Transfer of Polymer/Tin/Gold/Tin/Polymer Film

A thermal donor element with a multicomponent transfer layer was prepared by applying coatings to the substrate/LTHC/interlayer element of Example 2. A coating of acrylic polymer (Elvacite™ 2776, ICI Acrylics) was applied to the interlayer of the thermal transfer element using a 5 wt. % aqueous solution of polymer with a #6 Mayer bar. The coating was dried at about 60° C. for about 5 minutes. A 500 Å coating of tin was vacuum deposited on top of the acrylic polymer. A 500 Å coating of gold was then vacuum deposited on the tin. Then, a second 500 Å coating of tin was vacuum deposited on the gold. A second coating of acrylic polymer (Elvacite™ 2776, ICI Acrylics) was prepared by applying a 5 wt. % aqueous solution of polymer with a #6 Mayer bar. The coating was dried at about 60° C. for about 5 minutes. The thermal transfer element was imaged onto a glass receptor using a linear scan speed of 5.6 m/s. The result was a uniform transfer of a polymer/tin/gold/tin/polymer film as 70 micron wide lines with excellent edge uniformity.

Example 5

Hole Transport Thermal Transfer Element

A hole transport thermal transfer element was formed using the substrate/LTHC/interlayer element of Example 1. A hole transport coating solution, formed by mixing the components of Table 5, was coated onto the interlayer using a #6 Mayer bar. The coating was dried for 10 min at 60° C.

TABLE 5

Hole Transport Coating Solution

| Component | Weight (g) |
|---|---|
| N,N'-bis(3-methylphenyl)-N,N'-diphenylbenzidine | 2.5 |
| polyvinylcarbazole | 2.5 |
| cyclohexanone | 97.5 |
| propylene glycol methyl ether acetate (PGMEA) | 97.5 |

Example 6

OEL Thermal Transfer Element

An OEL thermal transfer element with a multicomponent transfer layer was prepared by applying coatings to a substrate/LTHC/interlayer element formed according to Example 1. A 200 Å layer of copper phthalocyanine was deposited on the interlayer as a semiconducting release layer. Next, a 250 Å layer of aluminum was deposited as a cathode layer. A 10 Å layer of lithium fluoride was deposited on the aluminum. Next, a 300 Å layer of tris(8-hydroxyquinolinato) aluminum (ALQ) was deposited as an electron transport layer. Finally, a 200 Å layer of N,N'-bis(3-methylphenyl)-N,N'-diphenylbenzidine (TPD) was deposited as a hole transport layer.

Example 7

Preparation of an OEL Device

A receptor substrate of glass covered with indium tin oxide (ITO) (10 Ω/square, Thin Film Devices Inc., Anaheim, Calif.) was used to form the anode of the OEL device. First, the Hole Transport thermal transfer element of Example 5 was imaged onto the receptor. This was followed by imaging of the OEL thermal transfer element of Example 6 to complete the OEL device.

In each transfer, the transfer layer side of the thermal transfer element was held in intimate contact with the receptor in a vacuum chuck. A laser was directed to be incident upon the substrate side of the thermal transfer elements. The exposures were performed so that the two transfer layers were transferred with correct registration. This produced 120 μm wide lines. The final OEL device had layers in the following order (from top to bottom):

Aluminum Cathode
Lithium Fluoride
ALQ Electron Transport Layer/Emitter
TPD Hole Transport Layer (from OEL thermal transfer element)
TPD Hole Transport Layer (from Hole Transport thermal transfer element)
Glass Receptor Electrical contact was made at the ITO anode and the aluminum cathode. When a potential was applied, the OEL device produced visually detectable light. The injection current was monitored as a function of the applied potential (voltage) which was continuously swept from 0 volts to 10–30 volts. At one point 70 μA at 10 volts flowing through a 42 mm×80 μm device was measured. This corresponds to a current density of about 2 mA/cm$^2$. The current density is well within the normal operating range of small molecule devices fabricated directly onto a receptor substrate using conventional techniques.

Example 8

Another OEL Thermal Transfer Element

An OEL thermal transfer element with a multicomponent transfer layer was prepared by applying coatings to a substrate/LTHC/interlayer element prepared according to Example 1. A primer solution A, according to Table 6, was first coated using a #3 Mayer bar. The coating was dried at about 60° C. for about 5 minutes.

TABLE 6

| Primer Solution | | |
|---|---|---|
| Component | Source | Weight (g) |
| PVP K-90 (polyvinyl pyrrolidone) | International Specialty Products (Wayne, NJ) | 2 |
| PVA Gohsenol KL-03 (polyvinyl alcohol) | Nippon Gohsei (Osaka, Japan) | 2 |
| Elvacite 2776 (acrylic polymer) | ICI Acrylics | 4 |
| DMEA (dimethylethanolamine) | Aldrich | 0.8 |
| 2-butoxyethanol | Aldrich | 0.8 |
| deionized water | — | 150.4 |

A 200 Å layer of copper phthalocyanine was deposited as a semiconducting release layer on the primer layer. Next, a 250 Å layer of aluminum was deposited as a cathode layer. A 10 Å layer of lithium fluoride was deposited on the aluminum. Next, a 300 Å layer of tris(8-hydroxyquinolinato) aluminum (ALQ) was deposited as an electron transport layer. Finally, a 200 Å layer of N,N'-bis (3-methylphenyl)-N,N'-diphenylbenzidine (TPD) was deposited as a hole transport layer.

Example 9

Transfer of a Partial OEL Transfer Layer to a Flexible Substrate

The receptor substrate consisted of a piece of 4 mil (about 100 μm) polyethyleneterephthalate (PET) film (unprimed HPE100,Teijin Ltd., Osaka, Japan). First, the Hole Transport thermal transfer element of Example 5 was imaged onto the receptor. Then the OEL thermal transfer element of Example 8 was imaged onto the hole transport layer.

In each transfer, the transfer layer side of the thermal transfer element was held in intimate contact with the receptor in a vacuum chuck. A laser was directed to be incident upon the substrate side of the thermal transfer elements. The exposures were performed so that the two layers with correct registration. This produced 120 μm wide lines. The final construction had layers in the following order (from top to bottom):

Aluminum Cathode
Lithium Fluoride
ALQ Electron Transport Layer/Emitter
TPD Hole Transport Layer (from OEL Thermal Transfer Element)
TPD Hole Transport Layer (from Hole Transport thermal transfer element)
PET Receptor The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

We claim:

1. A method for making an organic electroluminescent device, comprising the steps of:
   providing a donor element comprising a multicomponent transfer layer having at least two layers, at least one of which contains an organic electroluminescent material and at least another of which contains a charge conductive or semiconductive material;
   placing the transfer layer of the donor element proximate a receptor substrate; and
   selectively heating the donor element to transfer the transfer layer to the receptor.

2. The method of claim 1, further comprising repeating the steps of claim 1 using another donor element comprising another multicomponent transfer layer having at least two layers, at least one of which contains another organic electroluminescent material.

3. The method of claim 2, further comprising repeating the steps of claim 2.

4. The method of claim 1, wherein the step of selectively heating is performed using a thermal print head.

5. The method of claim 1, wherein the step of selectively heating is performed using light to irradiate a light-to-heat converter disposed in the donor element.

6. The method of claim 1, wherein the donor element further comprises a light-to-heat conversion layer disposed between the substrate and the transfer layer.

7. The method of claim 6, wherein the donor element further comprises an interlayer disposed between the light-to-heat conversion layer and the transfer layer.

8. The method of claim 1, wherein the donor element further comprises a release layer disposed between the transfer layer and the rest of the donor element.

9. The method of claim 1, wherein the organic electroluminescent material of the transfer layer is a light emitting polymer.

10. The method of claim 1, wherein the organic electroluminescent material of the transfer layer is an organic small molecule.

11. The method of claim 1, wherein the organic electroluminescent material of the transfer layer is a light emitting polymer doped with an organic small molecule.

12. The method of claim 1, wherein the transfer layer includes an electrode layer.

13. The method of claim 1, wherein the transfer layer includes an electron transport layer.

14. The method of claim 1, wherein the transfer layer includes a hole transport layer.

15. The method of claim 1, wherein the transfer layer includes an adhesion promoting layer for contact with the receptor during transfer.

16. A thermal transfer donor element for making organic electroluminescent devices comprising a substrate and a multicomponent transfer layer comprising, in order from the substrate, a cathode layer, an organic emitter layer, and a hole transport layer.

17. The donor element of claim 16, further comprising a release layer disposed between the cathode layer and the substrate.

18. The donor element of claim 16, further comprising an electron transport layer disposed between the cathode layer and the emitter layer.

19. The donor element of claim 16, further comprising an anode layer disposed such that the hole transport layer is between the emitter layer and the anode layer.

20. The donor element of claim 16, further comprising an adhesion promoting layer as the outer most layer of the transfer layer.

21. The donor element of claim 16, wherein the emitter layer comprises a light emitting polymer.

22. The donor element of claim 16, wherein the emitter layer comprises an organic small molecule.

23. The donor element of claim 16, wherein the emitter layer comprises a light emitting polymer doped with an organic small molecule.

24. The donor element of claim 16, wherein the cathode layer comprises a conductive inorganic layer.

25. The donor element of claim 16, wherein the cathode layer comprises a conductive organic layer.

26. The donor element of claim 16, wherein the hole transport layer comprises a conductive inorganic layer.

27. A thermal transfer donor element for making organic electroluminescent devices comprising:

a substrate;

a multicomponent transfer layer comprising, in order from the substrate, a copper phthalocyanine release layer, a cathode, an organic electroluminescent layer, and a hole transport layer;

a light-to-heat conversion layer disposed between the substrate and the transfer layer; and an interlayer disposed between the light-to-heat conversion layer and the transfer layer.

* * * * *

UNITED STATES PATENT AND TRADEMARK OFFICE
CERTIFICATE OF CORRECTION

PATENT NO. : 6,140,009
DATED : October 31, 2000
INVENTOR(S) : Martin B. Wolk, Paul F. Baude, Fred B. McCormick and Yong Hsu It is certified that error appears in the above-identified patent and that said Letters Patent is hereby corrected as shown below:

<u>Column 10,</u>
Line 21, "0.1 μum" should read -- 0.1 μm --.

<u>Column 11,</u>
Line 48, insert a period after "thereof".

<u>Column 19,</u>
Line 27, "x $10^{-5}$" should read -- 1 x $10^{-5}$ --.
Line 50, "mmn" should read -- mm --.

Signed and Sealed this

Thirty-first Day of December, 2002

JAMES E. ROGAN
*Director of the United States Patent and Trademark Office*